United States Patent
Burke et al.

(10) Patent No.: US 6,325,871 B1
(45) Date of Patent: Dec. 4, 2001

(54) METHOD OF BONDING CAST SUPERALLOYS

(75) Inventors: Michael A. Burke, Pittsburgh; Paula D. Freyer, Cranberry Township, both of PA (US); Mohan A. Hebbar, Oviedo; Brij B. Seth, Maitland, both of FL (US); Gary W. Swartzbeck, North Huntingdon, PA (US); Thomas Walter Zagar, Winter Springs, FL (US)

(73) Assignee: Siemens Westinghouse Power Corporation, Orlando, FL (US)

( * ) Notice: Subject to any disclaimer, the term of this patent is extended or adjusted under 35 U.S.C. 154(b) by 0 days.

(21) Appl. No.: 09/509,622

(22) PCT Filed: Oct. 27, 1998

(86) PCT No.: PCT/US98/22766

§ 371 Date: Jul. 6, 2000

§ 102(e) Date: Jul. 6, 2000

(87) PCT Pub. No.: WO99/21681

PCT Pub. Date: May 6, 1999

Related U.S. Application Data
(60) Provisional application No. 60/063,640, filed on Oct. 27, 1997.

(51) Int. Cl.[7] ............................. B23P 15/04; C22F 1/10
(52) U.S. Cl. ..................... 148/522; 148/555; 148/562; 148/675
(58) Field of Search ..................... 148/522, 555, 148/562, 675, 410, 428; 416/241 R

(56) References Cited

U.S. PATENT DOCUMENTS

| | | |
|---|---|---|
| 1,829,179 | 10/1931 | Back . |
| 3,067,982 | 12/1962 | Wheeler, Jr. . |
| 3,342,455 | 9/1967 | Fleck et al. . |
| 3,536,121 | 10/1970 | Piearcey . |

(List continued on next page.)

OTHER PUBLICATIONS

Tuah–Poku, I. et al., "A Study of the Transient Liquid Phase Bonding Process Applied to a Ag/Cu/Ag Sandwich Joint," *Metallurgical Transactions*, vol. 19A, pp. 675–686, Mar. 1988.

Duvall, D.S. et al., "TLP Bonding: A New Method for Joining Heat Resistant Alloys," *Welding Journal*, vol. 53, 203–14, Apr. 1974.

Giamei, A.F. et al., "Energy Efficient Engine High–Pressure Turbine Single Crystal Vane and Blade Fabrication Technology Report," *U.S. Department of Commerce National Technical Information Service*, Jul. 1981.

Frasier, D.J. et al., "Process and Alloy Optimization for CMSX–4® Superalloy Single Crystal Airfoils," *High Temperature Materials for Power Engineering*, pp. 1281–1300, 1990.

MacKay R.A. et al., "Microstructure–Property Relationships in Directionally Solidified Single–Crystal Nickel–Base Superalloys," *MiCon 86—Optimization of Processing Properties and Servce Performance through Microstructural Control, ASTM STP 979*, 1988.

(List continued on next page.)

Primary Examiner—George Wyszomierski
(74) Attorney, Agent, or Firm—Eckert Seamans Cherin & Mellott, LLC

(57) ABSTRACT

A method of bonding cast superalloys is disclosed. The method includes the steps of casting separate superalloy component parts, machining the mating surfaces of the separate parts in a controlled manner to avoid recrystallization of the material and to ensure a tight fit between the parts, bonding the parts together, and thermally treating the bonded component. In a preferred embodiment, the component is a turbine blade for a land-based gas turbine.

31 Claims, 8 Drawing Sheets

U.S. PATENT DOCUMENTS

| | | |
|---|---|---|
| 3,753,794 | 8/1973 | Paulonis et al. . |
| 3,940,268 | 2/1976 | Catlin . |
| 3,981,344 | 9/1976 | Hayes et al. . |
| 4,059,217 | 11/1977 | Woodward . |
| 4,089,456 | 5/1978 | Toppen et al. . |
| 4,096,615 | 6/1978 | Cross . |
| 4,186,473 | 2/1980 | Cross et al. . |
| 4,311,433 | 1/1982 | Bratton et al. . |
| 4,364,160 | 12/1982 | Eiswerth et al. . |
| 4,376,004 | 3/1983 | Bratton et al. . |
| 4,417,381 | 11/1983 | Higginbotham . |
| 4,447,188 | 5/1984 | Davis et al. . |
| 4,475,980 | 10/1984 | Rhemer et al. . |
| 4,507,051 | 3/1985 | Lesgourgues et al. . |
| 4,529,452 | 7/1985 | Walker . |
| 4,538,331 | 9/1985 | Egan et al. . |
| 4,592,120 | 6/1986 | Egan et al. . |
| 4,611,752 | 9/1986 | Jahnke . |
| 4,614,296 | 9/1986 | Lesgourgues . |
| 4,637,448 | 1/1987 | Burke et al. . |
| 4,659,288 | 4/1987 | Clark et al. . |
| 4,700,881 | 10/1987 | Ryan . |
| 4,768,700 | 9/1988 | Chen . |
| 4,784,572 | 11/1988 | Novotny et al. . |
| 4,784,573 | 11/1988 | Ress, Jr. . |
| 4,796,343 | 1/1989 | Wing . |
| 4,817,858 | 4/1989 | Verpoort . |
| 4,869,645 | 9/1989 | Verpoort . |
| 4,921,405 | 5/1990 | Wilson . |
| 5,061,154 | 10/1991 | Kington . |
| 5,071,059 | 12/1991 | Heitman et al. . |
| 5,240,518 | 8/1993 | Wortman et al. . |
| 5,318,406 | 6/1994 | Bardes . |
| 5,358,029 | 10/1994 | Baveja et al. . |
| 5,419,039 | 5/1995 | Auxier et al. . |
| 5,503,532 | 4/1996 | Schilling . |
| 5,509,980 | 4/1996 | Lim . |
| 5,611,670 | 3/1997 | Yoshinari et al. . |
| 5,621,968 | 4/1997 | Kikkawa et al. . |

OTHER PUBLICATIONS

Nakahashi, M. et al., "Transient Liquid Phase Bonding for Ni–base Superalloys Mar–M247 and IN939," *Materials Transactions*, vol. 33, pp. 60–65, 1992.

Zheng, Y. et al., "Microstructure of Ni–10Co–8Cr–4W–13Zr Alloy and its Bonding Behaviour for Single–Crystal Nickel–base Superalloys," *Journal of Materials Science*, vol. 28, p. 823–29, 1993.

Noebe, R. D. et al., "Joining of NiAl to Ni–Base Superalloys," Paper 29, pp. 1–12, No Date.

As-Cast/Bond/Solution + Precipitation

METHOD OF BONDING CAST SUPERALLOYS

CROSS REFERENCE TO RELATED APPLICATION

This application claims the benefit of U.S. Provisional Application Serial No. 60/063,640 filed Oct. 27, 1997.

GOVERNMENT CONTRACT

This invention was made with Government support under Contract No. 70NANB5H1131 awarded by the United States Department of Commerce. The Government has certain rights in this invention.

FIELD OF THE INVENTION

The present invention relates to bonding of cast superalloys, and more particularly relates to a method of bonding cast superalloy components for turbines and the like.

BACKGROUND INFORMATION

State-of-the-art blades and vanes that are employed in modern, high efficiency power generation combustion turbine engines rely on high quality materials such as single crystal alloys and precise control of the part's internal and external dimensions. Because of the large size of these parts, cost-effective manufacturing is being pursued by several routes.

Land-based gas turbines, such as the advanced turbine system (ATS) which is under development, require cost-effective high performance components fabricated from advanced materials. First and second row turbine blades and vanes include complex internal and external geometries, and should be fabricated from defect-free materials. Although components with such features have been developed for aircraft engines, the larger size of power generation turbine components provides a crucial challenge. To date, casting trials have been unable to produce defect-free large components in any significant yields.

An alternative manufacturing approach would be to cast essentially defect-free smaller subcomponents, and to subsequently join them using a high quality bonding process. Currently, however, the required bonding technology for advanced single crystal-containing superalloys, such as CMSX-4, that are targeted for use in ATS-class engines is not available.

SUMMARY OF THE INVENTION

In accordance with an embodiment of the present invention, bonding of single crystal nickel base superalloys employs a bonding foil that is similar in composition to the base material but contains an additional melting point depressant such as from about 1 to about 3 weight percent boron to depress the melting temperature of the foil. The major element composition of the bonding foil is close to that of the base material in order to provide approximately uniform chemical distribution across the bond region after solidification. The bonding process occurs isothermally at a temperature that is above the melting point of the foil but below the macro-melting point of the alloy, e.g., by about 100 to 150° F. The bonding thermal cycle is sufficient to cause solid state diffusion to disperse the boron away from the bonded interface, thereby raising the local melting point to make the material suitable for conventional heat treatment of the single crystal. The method may be used to bond single crystal alloys such as CMSX-4 and the like.

Parts preparation for bonding large parts such as the blades of land based gas turbines requires very good bond surface matching or fit-up, on the order of about 0.0025 cm (0.001 inch) between the two surfaces. This precision can be produced in parts after casting by low stress grinding/machining of the surfaces or by co-electrodischarge machining of the mating parts. These procedures produce surface profiles that lie within about 0.0025 cm (0.001 inch). The method also produces surfaces that are sufficiently undeformed that they are not vulnerable to recrystallization during subsequent bonding and heat treatment cycling, including the high temperature solution treatment of SC alloys, e.g., the solution heat treatment of CMSX-4 at 2,408° F.

Single crystal nickel base superalloys can be bonded to polycrystalline superalloys using transient liquid phase bonding. The chemistry of the bonding medium, either paste or foil, and the thermal cycle required to effect bonding can be controlled so that the resultant joints display a continuous gradation of chemistry and microstructure, and the properties produced in the joint region are generally between those of the base single crystal or the polycrystalline material, e.g., at least about 80 percent of the properties of the weaker base material component.

By reducing the section size of the castings, improved quality can be induced in the finished part, i.e., the production of grain boundaries, slivers and freckles may be reduced as the section size of the casting is reduced. Moreover, because the cast section can be selected to be a solid section, casting problems associated with casting around relatively sharp features of internal cores can be avoided. By using these approaches to reduce the tendency of producing defective castings, casting yields on the order of 80 to 90 percent may be possible.

The present manufacturing method based upon the assembly of segmented sections such as turbine blade subcomponents. The segmented sections are specifically defined as being bound by low vulnerability surfaces that can be used as bonding planes. This segmentation divides the component into smaller segments that can be easily cast, that are suitable for easy assembly, and that position the bonding plane(s) in minimally stressed locations. Effectively, the design segmentation process attempts to identify continuous slowly curving surfaces that will not be subject to significant loading across the bond plane. Eliminating sharp curvatures and intruding and protruding features from the surface of the subcomponents not only enhances casting yields, but also facilitates the application of the bonding medium and the fixturing of the subcomponents during bonding.

The transient liquid phase bonding process presents an opportunity for bonding large blades of advanced single crystals. The bond foil chemistry can be tailored to provide continuous structures across bond regions even in single crystal structures provided that post bonding thermal processing can be adapted to provide the optimum γ/γ' structure in the bond region as well as in the base metal.

Computer aided design (CAD) coupled with state-of-the-art finite element modeling (FEM) greatly facilitates the development and mechanical analysis of segmented subcomponents. These techniques permit the definition of the blade geometry with segmentation surfaces dividing the solid model into distinct domains. Starting from the original blade, segmentation proceeds by selecting potential segmentation surfaces and assessing them quantitatively from the point of view of the anticipated loads across the surface. The surfaces are then considered qualitatively from the point of view of providing smooth continuous surfaces to facilitate casting and bonding. The selected surfaces(s) can then be modified to eliminate features such as sharp corners that will impair the casting quality and inhibit bonding. The modified surface can then be reanalyzed using FEM to reassess the potential loads across the bond line.

Current blade design requirements include high cycle fatigue, low cycle fatigue (LCF), creep, plasticity, and thermo-mechanical fatigue (TMF). The FEM analyses of the potential bond surface indicate whether the mechanical properties of the bonded metal can meet these requirements. Effectively, the bond region properties must surpass those defined by the requirements. Even though the present bonding process preferably targets 80 to 90 percent of the base metal performance, because the resulting material properties are reduced at the bond, the bond surface is placed in a location where the operating stresses are minimized.

While casting quality needs call for thinner section castings and more bonds, bonding efficiency calls for fewer bonds and thicker section castings. For example, the controlling cross-section of a single crystal blade may be approximately 102 mm (4 inches) thick. By designing the blade in two or more parts, this cross section can be reduced to as little as approximately 25 mm (1 inch) at its widest location. For most of the height of the blade, the casting thickness is actually less than approximately 13 mm (0.5 inches). An additional reduction in section width, for instance, from approximately 13 mm (0.5 inches) to 6 mm (0.25 inches), would markedly further improve the casting quality and yield.

The section of the primary bonding plane for a standard cored blade is chosen relative to the original core location. The preferred method usually locates the core along the center line of the airfoil section. The center line of the blade since this is generally a plane of low thermal flux and low mechanical stress. In cooled blades, the internal temperatures also are relatively low. Moreover, while high radial stresses can occur on this plane, the stresses across the bonding surfaces are low. Having chosen the traditional core split line through the airfoil, the separation is continued through the platform and center of the root. The stresses and temperatures become less of a concern below the top surface of the platform.

The center line location defines the initial primary mating surface for the blade segments. The break through to the external wall surfaces of the leading edge and trailing edge of the airfoil is then modified based on geometric considerations. The leading edge wall break through is located by the apex of the leading edge radius, which is typically the one piece casting wax pattern core die split line. At the trailing edge, this same approach is followed, with the trailing edge radius apex defining the location of the mating surface. After this modification of the proposed segmentation, the expected design stresses across the new bond plane are reanalyzed using the finite element model and compared to the expected properties of the bonded metal.

In accordance with a further embodiment of the present invention, separating the airfoil from the platform and root portion permits casting the airfoil as a very high precision structure under very stringent conditions while the platform and root could be cast under different conditions. By reducing the lengths and thicknesses of the individual castings, casting yield may also be improved. In this configuration, the continuation of the airfoil into the platform follows the pattern of the bottom of the airfoil-platform fillet radius and extends at least deep enough into the platform so that the local radial stresses drop below the target levels of the bonded material properties. This occurs at a depth equal to the airfoil wall thickness where the stresses are quite low and uniform across the section. At this location, the service temperatures also drop several hundred degrees below the airfoil temperatures.

The remaining segmentation of the blade parts is the paired splitting of the geometry of the platform and root shank areas. This segmentation primarily reduces the section size of the castings in order to further enhance casting yield. The remaining root sections may be split into approximately equal thickness portions. This split may produce a continuously curved surface that is essentially curved in one direction. Stresses and temperatures are relatively low across this plane.

By selecting the bonding surfaces where the required strength is less than 80 percent of the parent metal, all design criteria are met. Because the bonding process does not change modulus and the final blade geometry is the same for the bonded or single piece casting, no frequency change is expected. The bonding surfaces are specifically selected away from those locations where TMF or LCF may approach the limits. Notably, at the bond areas, the TMF and LCF life will be exceeded even with greater reduction in properties. The steady and vibratory stress contributions for the various modes are parallel rather than across the bonding planes or are at very low levels.

An aspect of the present invention is to provide a method of bonding cast superalloys. The method includes the steps of casting superalloy segments, preparing interfacing surfaces of adjacent segments to a specific tolerance, bonding the segments together with a bonding medium, and precipitation heat treating the segments.

This and other aspects of the present invention will be more apparent from the following description.

DETAILED DESCRIPTION

The ability to bond single crystal portions of superalloy components such as gas turbine components to each other opens up the potential not only for cost effective manufacturing of substantially defect-free single crystal blades and vanes, but also allows for the development of advanced components that incorporate advanced geometric features, such as precisely corrugated cooling passages, that cannot be manufactured by conventional single piece castings. The present method enables high yield production of complex defect-free single crystal parts for gas turbines and the like. The present method also provides the capability to rework and repair such components.

Because of the severe temperature and stress operating conditions for which single crystal gas turbine components are intended, bonded single crystals must display continuous and nearly optimum chemistry, crystallography and microstructure across the bond line. Under these conditions the bond region properties limit the stress and temperature conditions to which the structure can be exposed. In particular, the high temperature strength requirements dictate that the γ/γ' microstructure in the bond region should be substantially equivalent to that elsewhere in the single crystal. For second generation superalloys as exemplified by the alloy CMSX-4 this is a continuous regular arrangement of approximately 0.5 μm cuboids of γ' with finer spheroidal secondary and tertiary distributions of γ' in the γ channels between the cuboids.

Figure 1:
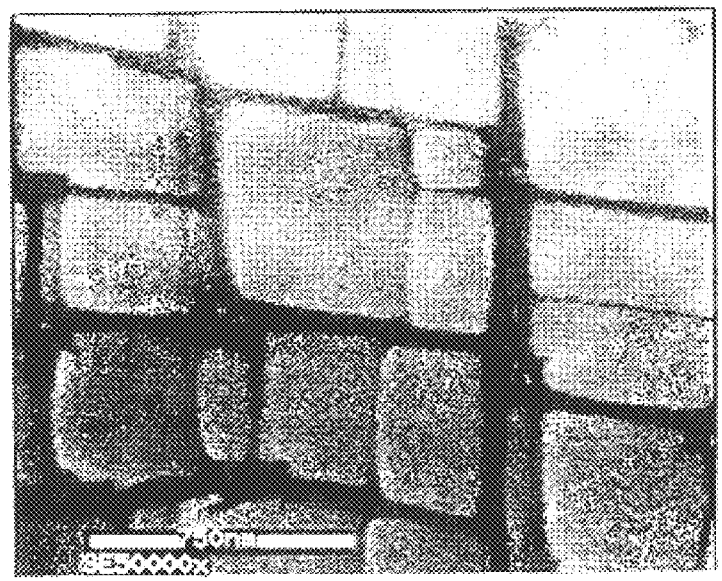
FIG. 1 is a photomicrograph showing a preferred microstructure for a single crystal nickel base superalloy.

FIG. 1 illustrates this optimum structure for the single crystal alloy CMSX-4. This structure is optimized to give the best high temperature time dependent properties such as creep resistance.

Transient liquid phase bonding is a joining process that produces high quality joints in superalloys. In this isothermal process, a thin strip of bonding material, e.g., foil or agglomerate paste, is placed between the two portions of the material to be bonded. The bonding material is similar to the base material but it also contains an extra addition of melting point depressing element that also exhibits rapid solid state diffusion in the alloy. For nickel base alloys Si and B are preferred melting point depressants. For high temperature applications that would be experienced in bonded single crystal components B is preferred because Si can cause corrosion problems.

The present process is conducted substantially isothermally at a temperature that lies above the melting point of the foil but below the bulk melting point of the base material. As the boron rich foil melts it wets the base material on either side of the bond and causes some dissolution of the base metal and a wider liquid zone. As the liquid zone widens the concentration of boron in the liquid falls until the melt pool is sufficiently diluted in B that it is at the equilibrium liquidus concentration. Simultaneously solid state diffusion causes boron to be removed from the bond pool environs. These two processes result in depletion of the melting point depressant from the bond pool and isothermal resolidification of the bond pool until the two solidification fronts meet at approximately the center line of the bond.

By carefully controlling the chemistry of the bond medium and the temperature of the bonding process. The present isothermal bonding process can be controlled to reproduce the chemistry and microstructure of the base material within the bond zone.

During the bonding process, certain parameters are preferably controlled. The amount of melting point depressant should be sufficient to provide a bonding foil that will melt significantly (i.e., a few hundred ° F.) below the base material. The bonding temperature should be sufficient to melt the bond foil and a similar thickness of the base material to produce a fine, well mixed bond zone. The amount of bonding foil should be sufficient to produce melting of the base material and provide a fine well controlled bond joint. The bond zone melting and resolidification should be sufficiently well controlled that deleterious chemical and phase separation does not occur within the bond zone. The major element chemistry of the bond foil (i.e., Ni, Cr, Co, Al, Ti, Ta, W, Mo, Nb etc.) should be sufficiently well matched to the material to be bonded that the chemistry and structure of the bond zone are effectively continuous with those of the base material. The bond foil composition does not have to be identical to that of the base material since some mixing will take place in the molten zone. Also, because Al and Ti will segregate to the final material to solidify these elements may be removed from the bond foil in order to avoid the formation of deleterious γ' eutectics at the bond center line. In addition, it is preferred to control or match the crystallography across the bond, i.e., match the crystallographic orientations of the pieces to be bonded. The base material composition and its melting point, the bond foil major element composition, the amount of boron and the temperature for isothermal bonding are all interacting variables that determine the chemistry and structure of the bonds produced by the present process. The addition of B to a nickel base alloy depresses its melting point by about 100 to 150° F. per each weight percent addition. With melting points of over 2,400° F., and incipient melting points of the segregated as-cast form somewhat lower, foils comprising from about 1 to about 3 weight percent B can reduce the melting point to within the 2,000 to 2,300° F. regime that will allow for localized melting without overall melting. Although the major element composition of the bond foil is ideally very close to the base material, considerable differences can actually be tolerated. Because of the many alloying elements in a single crystal superalloy, small changes in the composition do not significantly affect the melting point. Also, dissolution of the base material into the bond zone melt pool tends to compensate for differences in bond foil and base metal composition. Furthermore, some expensive elements such as rhenium may not be desired in the foil in order to reduce costs. Finally, in order to suppress eutectic $\gamma'$ formation during resolidification of the bond region, the titanium and aluminum contents of the bond foil should be reduced.

The present method may be applied to nickel base single crystal superalloy CMSX-4. The composition of the alloy is given in Table 1. Also listed in Table 1 are the compositions of several bonding foils that may be used to fabricate transient liquid phase bonds with single crystals of CMSX-4.

temperature with respect to the boron content determines the width of the bond zone, the elemental mixing that occurs on dissolution, and the segregation that occurs on resolidification. Higher temperature bonding allows for rapid wetting of the bond surfaces by the melted foil, good bond pool mixing, and accelerated solid state diffusion of the boron to increase the rate of resolidification process. Higher temperature bonding also allows the use of reduced B containing foils, thereby avoiding the need for extensive solid state diffusion and the potential formation of boride particles during the solidification process.

After initial trials, a bonding cycle of 2,250° F. for 4 hours was selected for the bonding foils since this temperature produced controlled bond regions and did not appear to produce any deleterious $\gamma'$ growth. Because of the large alloying content of the base alloy and the foil, the metallic element composition of the foils does not have a significant effect on the melting point depression of the base alloy. It does, however, have a significant effect on the chemical composition of the resolidified bond zone and the microstructure that is generated within the bond zone upon heat treatment. The chemical segregation of the elements within the bond zone after solidification is controlled by the bond zone size and the degree of dissolution of the base metal during the first stages of the bonding process. It is also affected by the state of the base material, i.e., segregated or homogenized. This issue is manifested in bonding of the as-cast CMSX-4 with high boron containing foils in which

TABLE 1

Base Alloy and Bond Foil Compositions (Weight Percent)

| Alloy | Ni | Cr | Co | Al | Ti | Nb | Mo | Ta | W | Re | Hf | Zr | B |
|---|---|---|---|---|---|---|---|---|---|---|---|---|---|
| CMSX-4 | bal | 6.6 | 9.6 | 5.5 | 1.0 | — | 0.6 | 6.5 | 6.4 | 3 | 0.9 | — | — |
| W-foil 1 | bal | 6.5 | 9.6 | 5.5 | 1.0 | — | 0.6 | 6.5 | 6.4 | 3 | 0.9 | — | 1.5 |
| W-foil 2 | bal | 6.5 | 9.6 | 2.9 | 0.5 | — | 0.6 | 6.5 | 6.4 | 3 | 0.9 | — | 1.5 |
| W-foil 3 | bal | 6.5 | 9.6 | 5.5 | — | — | 0.6 | 6.5 | 6.4 | 3 | 0.9 | — | 1.5 |
| W-foil 4 | bal | 6.5 | 10 | 2.9 | — | — | 0.6 | 6.5 | 6.4 | 3 | 0.9 | — | 1.5 |
| Ni-Flex 110 (1.3B) | bal | 10 | 5.0 | 2.0 | — | — | — | 4.0 | 4.0 | — | — | — | 1.3 |
| Ni-Flex 110 (1.7B) | bal | 10 | 5.0 | 2.0 | — | — | — | 4.0 | 4.0 | — | — | — | 1.7 |
| Ni-Flex 110 (2.5B) | bal | 10 | 5.0 | 2.0 | — | — | — | 4.0 | 4.0 | — | — | — | 2.5 |
| Ni-Flex 115 (3.0B) | bal | 9.0 | 8.0 | 2.0 | — | — | — | 4.0 | 4.0 | — | 1.0 | — | 3.0 |
| Ni-Flex 120 (1.7B) | bal | 10.0 | 5.0 | 1.3 | 1.0 | — | — | 5.0 | 3.0 | — | — | — | 1.5 |
| Ni-Flex 120 (1.9B) | bal | 10.0 | 5.0 | 1.3 | 1.0 | — | — | 5.0 | 3.0 | — | — | — | 1.7 |
| Ni-Flex 121 (2.4B) | bal | 10.0 | 10.0 | — | — | — | — | 5.0 | — | — | — | — | 2.4 |
| Ni-Flex 121 (3.0B) | bal | 10.0 | 10.0 | — | — | — | — | 5.0 | — | — | — | — | 3.0 |

The W-foils 1 to 4 are derivatives of the CMSX-4 alloy composition with 1.5 weight percent B added for melting point depressions. The amounts of Al and Ti are adjusted to study the effect of eutectic $\gamma'$ forming additions on the chemistry and structure of CMSX-4 bonds. The Ni-Flex foils are a series of commercial foils obtainable from Materials Development Corporation of Medford, Mass. Although the compositions of these foils appear to be significantly different from CMSX-4, excellent bonds were made with several of these foils as discussed below. Similarly, using such bonding materials, good bonds may be made in other nickel base superalloys, e.g., lower or higher Re content alloys.

The bonding temperature is selected to lie between the melting point of the foil and the melting point of the base material. Since boron depresses the melting point of nickel alloys by about 100 to 150° F. per each weight percent addition, 1 to 3 weight percent boron will depress the melting point of the single crystal alloys from over 2,400° F. into the 2,000 to 2,300° F. range. Control of the bonding $\gamma'$ eutectics are formed at the bond line due to preferential dissolution of the $\gamma'$ enriched interdendritic regions of the segregated casting. The eutectic material is then redeposited at the bond line. This problem can be alleviated or avoided by using homogenized, solution treated CMSX-4 if high boron foils are used. In this case, the homogenized structure melts uniformly to produce a melt pool that is less enriched in the $\gamma'$ eutectic forming elements. Consequently the resolidified bond zone does not display the deleterious $\gamma'$ eutectics.

TABLE 2

Ramped Solution Heat Treatment Cycle for CMSX-4

| Time (minutes) | Temp (° C.) | Temp (° F.) |
|---|---|---|
| 0 | 23 | 73 |
| 60 | 1027 | 1880 |
| 80 | 1027 | 1880 |

TABLE 2-continued

Ramped Solution Heat Treatment Cycle for CMSX-4

| Time (minutes) | Temp (° C.) | Temp (° F.) |
|---|---|---|
| 110 | 1235 | 2255 |
| 140 | 1235 | 2255 |
| 170 | 1260 | 2300 |
| 185 | 1260 | 2300 |
| 215 | 1277 | 2330 |
| 335 | 1277 | 2330 |
| 365 | 1288 | 2350 |
| 485 | 1288 | 2350 |
| 500 | 1296 | 2365 |
| 680 | 1296 | 2365 |
| 695 | 1304 | 2380 |
| 875 | 1304 | 2380 |
| 890 | 1313 | 2395 |
| 1130 | 1313 | 2395 |
| 18hours50minutes | | total cycle time |

Post bond heat treatment should generate the optimum chemistry and structure, not only on the bond region but also in the remaining portions of the base metal. This heat treatment cycle should homogenize the segregated structures obtained after casting and resolidification, and also cause the precipitation and growth of the optimum form of the strengthening γ' precipitates. Solutioning and heat treatment cycles for CMSX-4 may be adequate to achieve this. The solution treatment is preferably a ramped heat treatment of the type identified in Table 2. By slowly increasing the temperature during this cycle, incipient melting is substantially avoided by allowing solid state interdiffusion that raises the local melting temperature. This bonding and solution heat treatment process is effective in homogenizing as-cast single crystals, and it is also effective in homogenizing the resolidified bond zone. Furthermore, it is effective in increasing dispersion of the boron through the single crystal to prevent melting of the boron enriched bond line. For example, it helps avoid the potential problem that the bond zone developed after 4 hours at 2,250° F. may have a melting point below the peak solution treating temperature of 2,408° F. The potential exists for shortening this cycle since the 4 hours at 2,250° F. will have assisted in homogenizing the segregated single crystal, and diffusion of boron is more rapid than diffusion of the metallic alloying elements.

After solution heat treatment, a precipitation heat treatment sequence is preferably applied to generate the optimum form of the strengthening γ' precipitates. The conventional treatment of 2,084° F. for 4 hours and 1,650° F. for 24 hours is applied to generate approximately 0.5 μm cuboidal primary γ' precipitates and a dispersion of spheroidal secondary and tertiary γ' precipitates in the matrix channels between the cuboids. By applying these heat treatments which have been developed for processing the base single crystal alloy, the microstructure in the unbonded portions of the bonded part are optimally heat treated in a addition to the bonded region.

Figure 2:
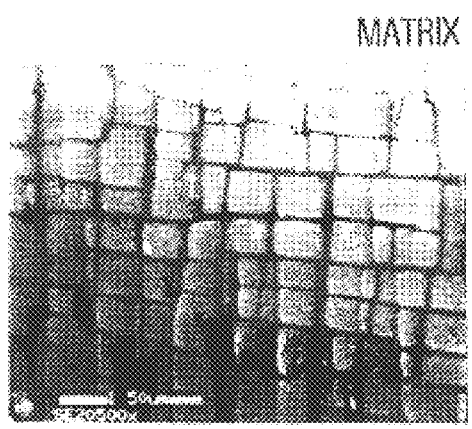
FIG. 2 is a photomicrograph showing the microstructure of a single crystal nickel-based superalloy that may be bonded in accordance with an embodiment of the present invention.
Figure 3:
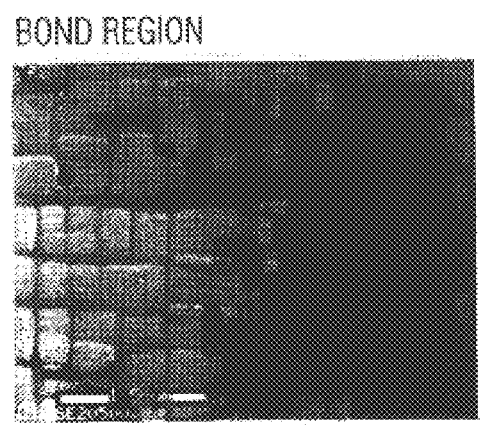
FIG. 3 is a photomicrograph showing the microstructure of a transient liquid phase bond region of the superalloy of FIG. 2.

FIG. 2 is a photomicrograph showing the base material of a single crystal nickel base superalloy, while FIG. 3 is a photomicrograph of the bond region of such a superalloy. These figures illustrate how similar structures are developed in the bond region and away from the bond region in a sample that has been bonded under the conditions of the present invention.

The preferred conditions for bonding CMSX-4 single crystals is to use a 1.3 weight percent B foil, bonding at 2,250° F. for 4 hours followed by solution heat treatment using a ramped heat treatment up to 2,408° F., holding for 4 to 6 hours, cooling to room temperature, and subsequently precipitation heat treating at 2,084° F. for 4 hours and 1,650° F. for 24 hours. This process generates the preferred structure. Other variations of this process can be employed to generate acceptable microstructures.

Table 3 shows how foils identified in Table 1 can be processed to deliver uniform bond structures. This table also identifies some of the key microstructural features that are developed during processing.

Figure 4:
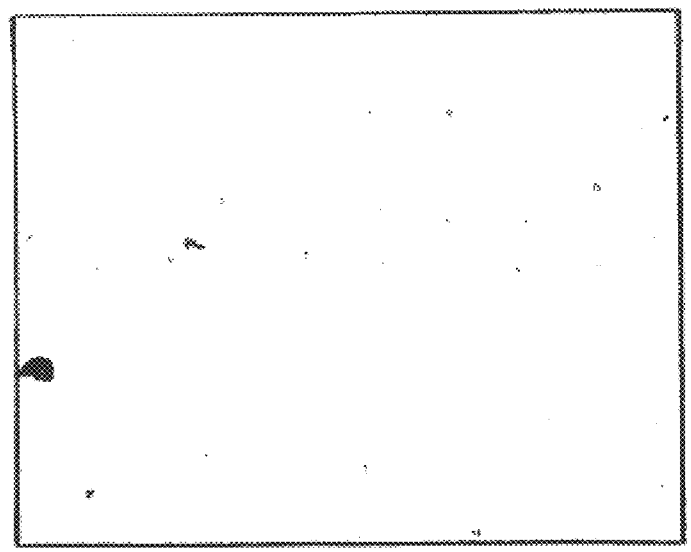
FIG. 4 is a photomicrograph showing the as-cast structure of a single crystal nickel-based superalloy bonded with a boron-containing foil.

FIG. 4 illustrates the clean bond region that is produced by bonding CMSX-4 with one of the low B bonding foils.

Figure 5:
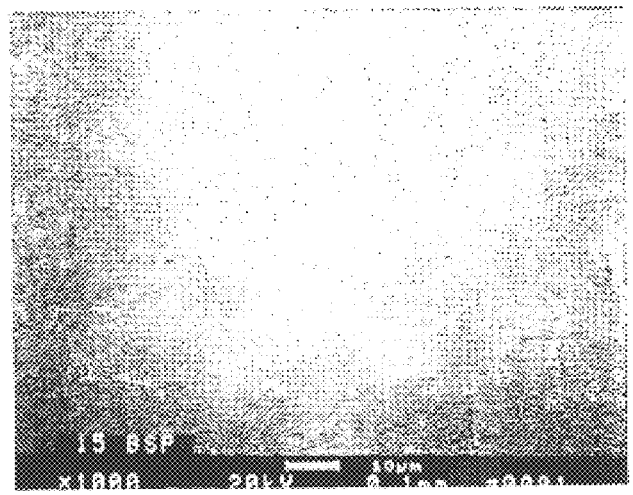
FIG. 5 is a photomicrograph showing the microstructure of the superalloy of FIG. 4 after heat treatment.

FIG. 5 shows a corresponding micrograph after solution heat treatment.

Figure 6:
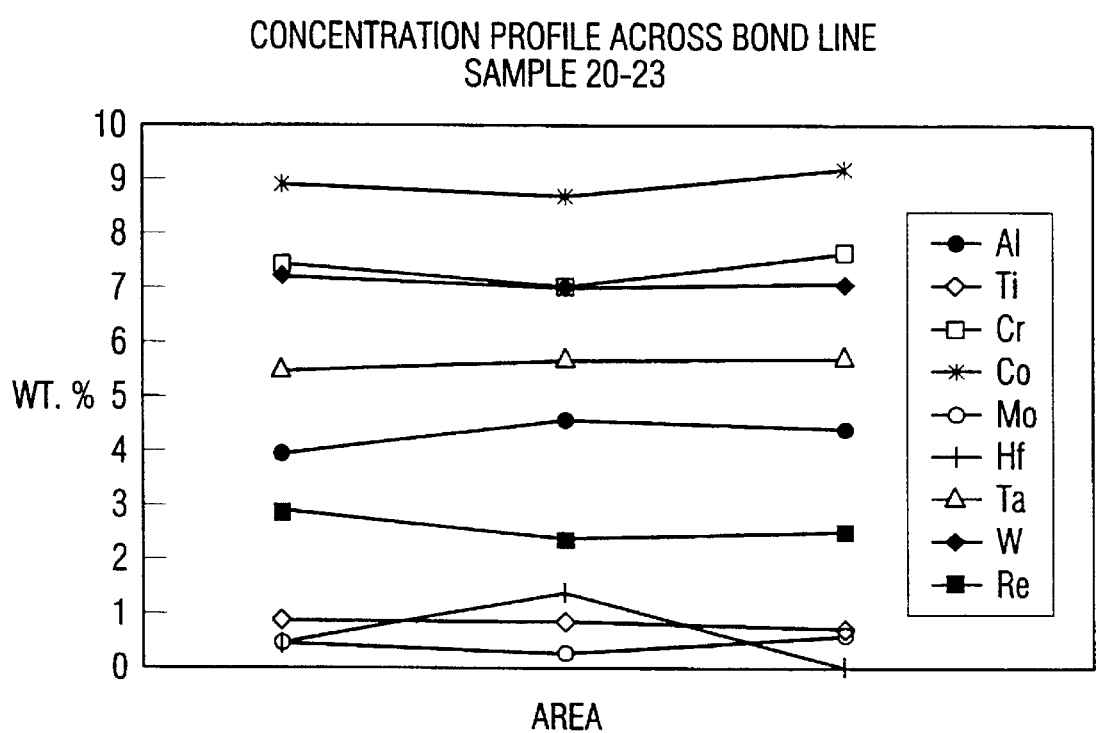
FIG. 6 is a graph showing the concentration of several elements across a transient liquid phase bond zone of a single crystal nickel-based superalloy bonded with a boron-containing foil.

FIG. 6 presents some chemical analysis traces across the solution treated region.

Figure 7:
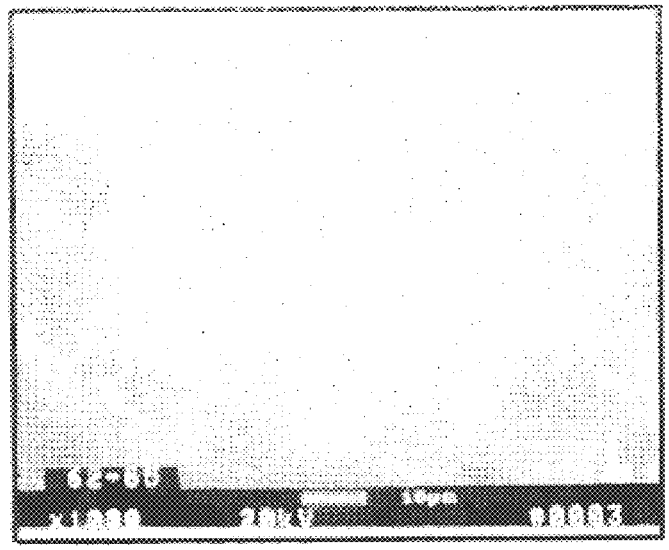
FIG. 7 is a photomicrograph showing the microstructure of a single crystal nickel-based superalloy that has undergone transient liquid phase bonding and thermal processing in accordance with an embodiment of the present invention.
Figure 8:
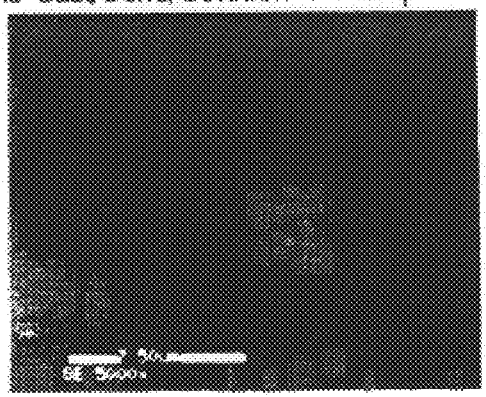
FIG. 8 is a photomicrograph showing a preferred microstructure of a single crystal nickel-based superalloy that has undergone bonding and thermal processing in accordance with an embodiment of the present invention.

FIGS. 7 and 8 demonstrate the optimum γ' structure produced by this treatment.

Figure 9:
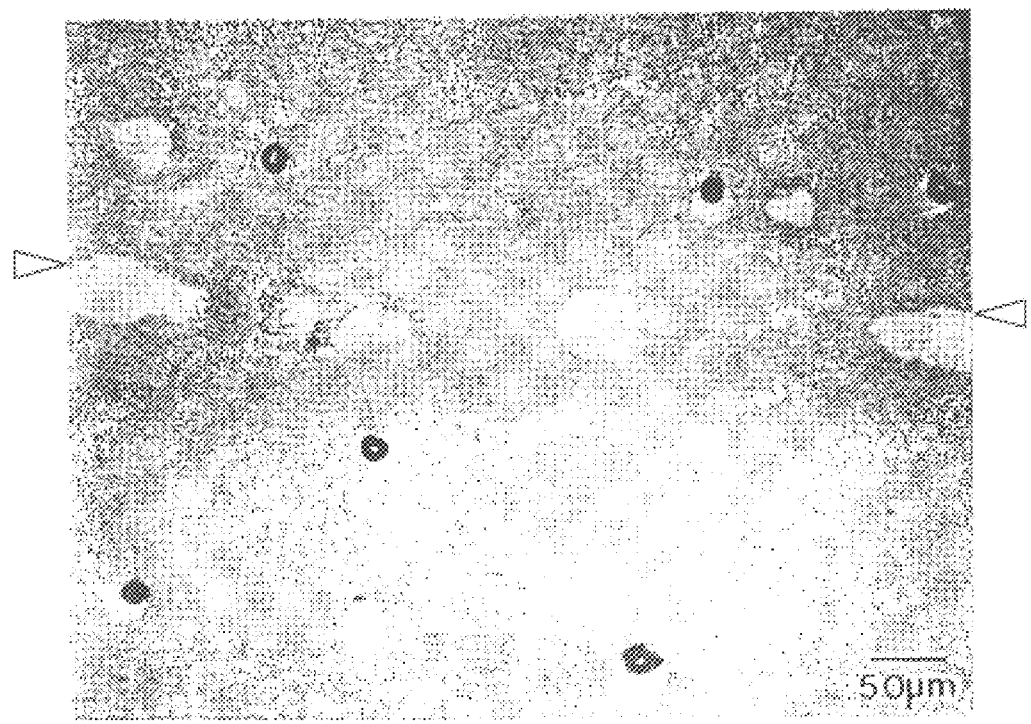
FIG. 9 is a photomicrograph showing deleterious boride particles formed at a bond line of a single crystal nickel-based superalloy bonded with a high boron-containing foil.
Figure 10:
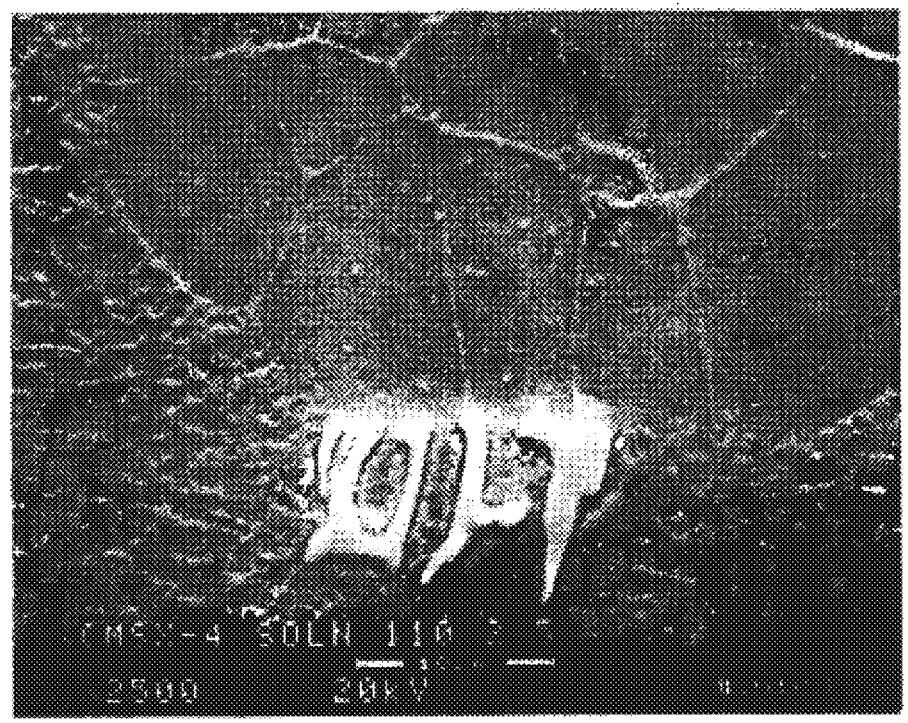
FIG. 10 is a photomicrograph showing the bond line of FIG. 9 at higher magnification.
Figure 11:
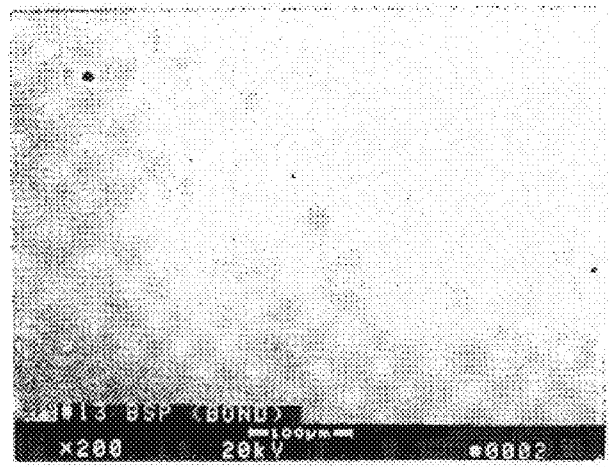
FIG. 11 is a photomicrograph showing a solutionized bond zone in a single crystal nickel-based superalloy bonded with a high boron-containing foil.
Figure 12:
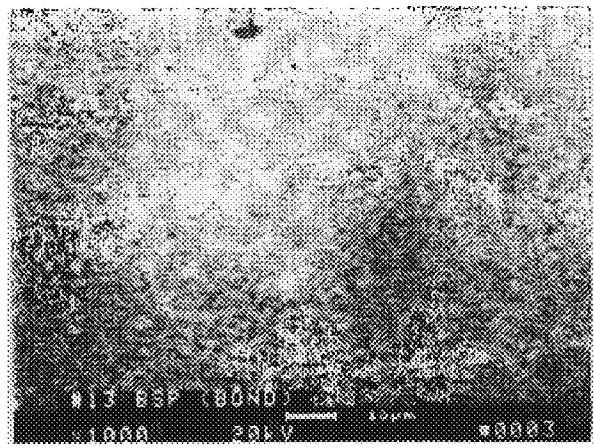
FIG. 12 is a photomicrograph showing an improved microstructure in the bond zone of a single crystal nickel-based superalloy that has undergone solution and precipitation treatment in accordance with an embodiment of the present invention.

For comparison, FIGS. 9 through 11 illustrate the structures produced during bonding with a high B foil. Note that the eutectic particles exhibited after bonding (FIGS. 9 and 10) are removed by the subsequent solution treatment (FIG. 11) and a structure approaching the optimum structure can be generated by precipitation heat treatment (FIG. 12).

TABLE 3

Structure of Transient Liquid Phase Bonds of CMSX-4 During Bond Processing and Heat Treatment

| Foil | Structure After Bonding | Structure After Solution Treatment | Structure After Precipitation Treatment | Preferred Process Cycle |
|---|---|---|---|---|
| W-foil 1 (1.5% B) | Clean bond region, i.e. no particles | No large particles uniform preliminary γ' particles | Uniform γ'; cuboidal; well formed | Bond in as-cast condition |
| W-foil 2 (1.5% B) | Clean bond region, i.e. no particles | No large particles uniform preliminary γ' particles | Uniform γ'; cuboidal; well formed | Bond in as-cast condition |
| W-foil 3 (1.5% B) | Clean bond region, i.e. no particles | No large particles uniform preliminary γ' particles | Uniform γ'; cuboidal; well formed | Bond in as-cast condition |
| W-foil 4 (1.5% B) | Clean bond region, i.e. no particles | No large particles uniform preliminary γ' particles | Uniform γ'; cuboidal; well formed | Bond in as-cast condition |
| Ni-Flex 110 (1.3B) | Always clean bond region | No large particles uniform precuboidal γ' particles | Extremely sharp γ' particles; cuboidal; identical to base | Bond in as-cast condition |

TABLE 3-continued

Structure of Transient Liquid Phase Bonds of CMSX-4
During Bond Processing and Heat Treatment

| Foil | Structure After Bonding | Structure After Solution Treatment | Structure After Precipitation Treatment | Preferred Process Cycle |
|---|---|---|---|---|
| Ni-Flex 110 (1.7B) | Always clean bond region | No large particles uniform precuboidal γ' particles | Very sharp γ' particles; cuboidal; very similar to base | Bond in as-cast condition |
| Ni-Flex 110 (2.5B) | Particles when bonded in solution treated condition | Particles dissolve on solution treatment | Sharper γ' cuboids when sol treated material is bonded | Bond in solution treated condition |
| Ni-Flex 115 (3.0B) | Particles when bonded in solution treated condition | Particles dissolve on solution treatment | Cuboidal γ'; rounded corners; larger than base material's | Bond in solution treated condition |
| Ni-Flex 115 (2.5B) | Particles when bonded in solution treated condition | Particles dissolve on solution treatment | Cuboidal γ'; rounded corners; larger than base material's | Bond in solution treated condition |
| Ni-Flex 115 (1.7B) | Always clean bond region | No large particles uniform precuboidal γ' particles | Cuboidal γ'; rounded corners; larger than base material's | Bond in as-cast condition |
| Ni-Flex 120 (1.7B) | Always clean bond region | No large particles uniform precuboidal γ' particles | Very sharp γ'; very similar to base material | Bond in as-cast condition |
| Ni-Flex 120 (2.5B) | Particles when bonded in solution treated condition | Particles dissolve on solution treatment | Very sharp γ'; very similar to base material; sharper in presolutionized material | Bond in solution treated condition |

In accordance with the present invention, transient liquid phase bonding of fabricated single crystal turbine parts produces high quality bonds when a very small, well controlled gap is induced between the mating surfaces. These tight tolerance surface requirements can be met reproducibly by surface profiling techniques. Furthermore, the stresses created by these profiling techniques must be sufficiently low such that they do not induce recrystallization from the deformed layer of cold work during subsequent thermal cycles, including bonding and heat treatment.

Surfaces for transient liquid phase bonding may be prepared by low stress grinding if the surface is sufficiently planar, or by electrodischarge machining (EDM) where the electrical conditions are sufficient to maintain a spark gap of about 0.0025 cm (0.001 inch) between the work piece and the work tool. For parts of complex profile that must fit together, such a surface profile can be produced by a co-EDM or co-ECM process which employs one of the mating pieces as the process anode and the other as the cathode. Subsequently, bonding using, for example, 0.0025 cm (0.001 inch) thick foil material or its equivalent in paste provides for sufficient melting and resolidification during bonding. The bond region material and material adjacent to the bond material do not recrystallize during the bond cycle or subsequently during higher temperature solution treating of the single crystal material.

Recrystallization is preferably avoided by maintaining a sufficiently small zone of deformation during shaping. In the absence of the transient liquid phase bonding process, the material is so minimally deformed that it will not recrystallize or will only recrystallize to a depth on the order of the thickness of a bonding foil, e.g., about 0.0025 cm (0.001 inch). In the presence of the bonding foil, the cold worked layer is rapidly consumed by the transient melting process and the resolidification process occurs as single crystal growth from the base material. Under these sets of conditions, recrystallization will not occur prior to transient melting at the bond regions. Subsequent melting and solidification reproduces defect free single crystals. If the single crystals are machined and bonded in the as-cast condition, subsequent solution heat treatment can be performed at temperatures as high as about 2,410° F. without causing recrystallization of in the bond region.

The single crystal alloy CMSX-4 may be bonded in the as-cast condition and subsequently heat treated if the surfaces are low stress ground according to the following process: cast single crystal parts; clean off mold with light sand blast of less than 100 psi air with 90 grit particles; low stress grind bonding surfaces flat and parallel to within 0.0025 cm (0.001 inch); bond at about 2,250° F. using foil Ni-Flex 110 comprising 1.3 weight percent B by ramp heating to 2,250° F. from 1,600° F. within 60 minutes in vacuum; solution treat bonded entity in vacuum using cycle shown in Table 2 (maximum temperature of 2,408° F. for 4 hours, cycle time about 16 to 24 hours); and precipitation treat (e.g, two step precipitation treat at 2,084° F. for 4 hours and 1,652° F. for 24 hours).

Low stress grinding not only produces flat and parallel surfaces that can be finished to a very high tolerance, on the order of fractions of a thousandth of an inch, but it also produces a relatively deformation free surface region in nickel base superalloys. Such ground surfaces do not contain sufficient stored plastic work to cause recrystallization in the near surface region. When these surfaces are heat treated, the surfaces do not recrystallize. Particularly, when the bonding material is melted over the worked surface, recrystallization is inhibited. For the competing processes of solid state γ' dissolution, local surface melting and recrystallization, it appears that local surface melting is the process with the most rapid kinetics.

Figure 13:
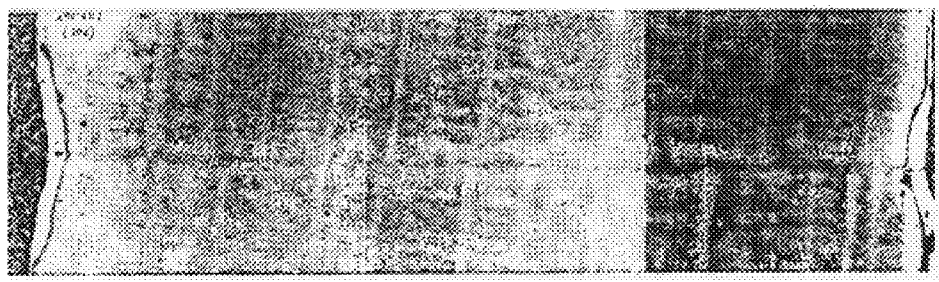
FIG. 13 is a photomicrograph showing a bond line between opposing surfaces of a single crystal nickel-based superalloy.

FIG. 13 is a micrograph of the cross-section of the bonded joint of two CMSX-4 single crystals which were prepared by low stress grinding prior to bonding and heat treatment. On another non-bonded surface of the sample that had been surface ground, recrystallization was also suppressed.

Alternatively, the single crystal alloy CMSX-4 may be bonded in the as-cast condition and subsequently heat treated if the bonding surfaces are prepared by co-electrodischarge machining using electrical conditions that produce a part gap of about 0.0025 cm (0.001 inch). The following process may be employed: cast single crystal parts; clean off mold with light sand blast of less than 100 psi air with 90 grit particles; co-EDM mating surfaces using sufficient voltage and current to produce a 0.0025 cm (0.001 inch) spark gap; bond at 2,250° F. using foil Ni-Flex 110 comprising 1.3 weight percent B which is heated to 2.250° F. from 1,600° F. within 60 minutes in vacuum; solution treat bonded article in vacuum using cycle similar to that shown in Table 2 (maximum temperature of 2,408° F. for 4 hours, cycle time of about 16 to 24 hours), and precipitation treat (e.g. two step precipitation treat at 2,084° F. for 4 hours and 1,652° F. for 24 hours).

Figure 14:
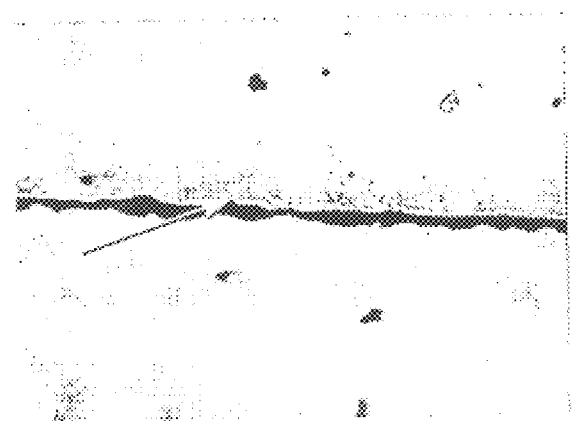
FIG. 14 is a photomicrograph showing the tight clearance between two opposing surfaces of single crystal nickel-based superalloy segments prior to transient liquid phase bonding thereof in accordance with an embodiment of the present invention.

FIG. 14 shows a cross-section containing the surface of the sample after co-EDMing. In this figure, the thin recast layer formed by EDM appears as the very light film at the surface of the sample.

Figure 15:
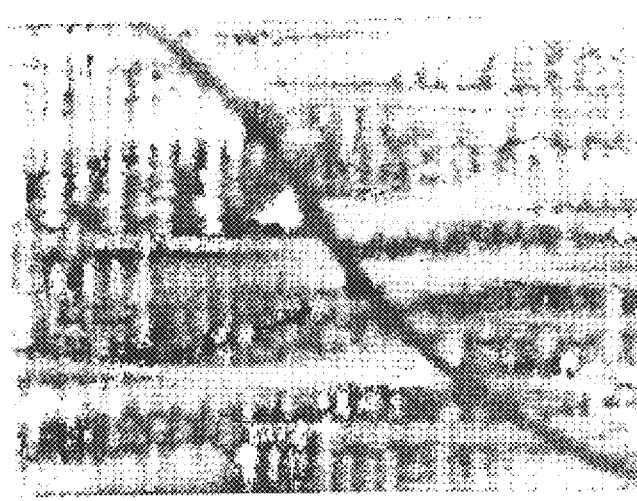
FIG. 15 is a photomicrograph showing a bond line between single crystal nickel-based superalloy segments.

FIG. 15 shows a cross-section of a CMSX-4 joint after bonding and heat treatment, demonstrating that the process produces single crystal resolidification and that the chemistry of the bond region has retained the as resolidified structure.

The present processes are sufficiently non deforming to inhibit recrystallization of the material near the bond surface. This property is required for the production of acceptable transient liquid phase bonds in single crystal materials such as CMSX-4. In addition to these machining processes, lower stress processes such as mechanical grinding to 600 grit finish and polishing, e.g., to 0.25 $\mu$m with diamond abrasive may be employed to produce surfaces of suitably low deformation that are suitable for bonding.

Because of the large size of land-based turbine components, very small distortions from design specifications can produce large absolute deviations from the desired parts profiles. While these offsets are significant in single piece castings, in the production bonded parts they become critical because of their influence on the relative fit-up between parts. Effectively, very small relative distortions between two parts can produce very large gaps that may be inadequately or incompletely filled by the bonding process. To produce bonded parts with acceptable quality it is desirable to control the casting process to restrict such gaps, or to modify the post cast processing to adjust the gaps between the parts. The proposed sequence of processes provides a simple series of processes that provide for the control of such gaps and effective bonding procedures.

The present sequence of processes avoids deleterious recrystallization. Recrystallization can occur when metal working processes and subsequent heat treatment cycles combine to provide sufficient stored cold work and sufficient thermal energy to locally form new grains. For nickel base single crystals used in turbine components, such working can include bending, indenting, chipping by metal working tools and even excessively severe cleaning by grit or shot blasting. The damage induced by these processes can cause recrystallization when they precede the solution treatment at about 2,400° F. that is required for such single crystals. In accordance with a preferred embodiment of the present invention, processes to manufacture fabricated parts from initial castings require sequencing of the cleaning, bonding and heat treatment cycles. For bonded parts it is desirable to remove substantially all of the remnants of the casting shell from the part before bonding. Additionally, bonding is preferably performed before solution treating. It is therefore critical to control and sequence the parts processing steps to avoid the potential of recrystallization. The present processing route limits the amount of deformation that is induced into parts by processing, and allows for a heat treatment cycle that provides optimized properties in the bond region as well as in the single crystal away from the bond.

Utilizing careful, low pressure cleaning, controlled high temperature shaping, and co-EDMing of fitting parts, the process provides a simple cost effective route to manufacture single crystal turbine blades from multiple cast parts.

For example, a single crystal gas turbine blade may be fabricated from separately cast parts by the following sequence: mechanically cleaning the parts prior to bonding; bonding the parts prior to applying a high temperature solution heat treatment; avoiding recrystallization during heat treatment that may arise from local deformation of the surface during cleaning; providing good fit up of the parts to be joined (e.g., to within 0.0025 cm (0.001 inch) across the bonded surface); and providing good parts profiles throughout the length of the blade. An integrated sequence involving transient liquid phase bonding of processed parts accomplished these objectives.

It is preferred to clean the cast parts and to make them conform precisely to the desired shape without inducing deformation that will impart recrystallization during subsequent heat treatment. Although cleaning of the mold from single crystal cast parts is conventionally performed after solution heat treatment to avoid recrystallization, the present components are fully cleaned prior to bonding. Because the best properties are produced when the bonding is performed prior to solution heat treatment, this cleaning should precede solution heat treatment. Because of the danger of inducing recrystallization, the deformation induced during cleaning by mechanical abrasion should be minimized. This requirement mandates low stress cleaning, although the introduction of the bond cycle will reduce the tendency to recrystallize during solution treatment.

For CMSX-4 abrasive cleaning in which the abrasive particles are limited to better than 60 grit and the (driving) gas pressure is limited to 90 psi has been shown to avoid recrystallization when the single crystals are subsequently solution heat treated using the cycle of Table 2.

Cleaning of the future internal surfaces of the part is required, and cleaning of the external surfaces is required in all regions that will be in contact with the mechanical fixturing that is intended to maintain a tightly closed gap across the bonding surfaces.

The problem of maintaining good parts profile in long castings can be solved by either improving casting precision or by invoking mechanical processing of the cast parts. Continuously adapting the parts mold to account for casting and thermal distortion will provide a means to produce in-tolerance profile parts that are susceptible to systematic and macroscopic distortions of the part and the mold. However, changing the part and the mold will not account for run-to-run variations and non-systematic deviations from the desired profile. Since small fractional deviations can induce considerable absolute offset from the required profile over the length of large land-based turbine components, these non-systematic or run-to-run deviations should be accommodated by other means. While polycrystalline alloys can be mechanically straightened at room temperature, conventional processing of single crystals avoids such mechanical deformation because of the danger of recrystallization. However, it may be possible to bend single crystals of nickel base superalloys to about 40 percent strain without causing recrystallization if the temperature and strain rate are effectively controlled. This process may be applied to parts straightening, e.g. adequate shape changes of about 2 to 3 percent, while inhibiting deleterious recrystallization upon subsequent solution heat treatment.

The issue of producing minimal and consistent gaps between parts to be bonded can be solved in accordance with the present invention by casting the parts over size, and machining the excess stock from the mating surfaces in a coordinated manner. The mating surfaces should then be aligned to within about 0.0025 cm (0.001 inch) to ensure a good transient liquid phase bond. Co-electrodischarge machining not only has the capability to finish the surfaces of matching components, but also provides a sufficiently smooth finish. Moreover, if the recast layer is controlled, post bonding recrystallization of the single crystal can be avoided. In co-EDM machining, material is removed from both of the work pieces since each piece is alternately employed as the cathode and the anode. The parts can be cast over size to provide more tolerance for the removal of material. Controlling the current during removal of material not only controls the gap between the parts (and the precision of this gap) but also controls the depth of the recast layer. The depth of the recast layer should be minimized to avoid the presence of surface and subsurface cracking and recrystallization on subsequent heat treatment. Maintaining the EDM current at a level that provides about a 0.0025 cm (0.001 inch) gap between the work pieces also constrains the recast layer to be sufficiently small such that it is consumed during the subsequent transient liquid phase bonding.

Figure 16:
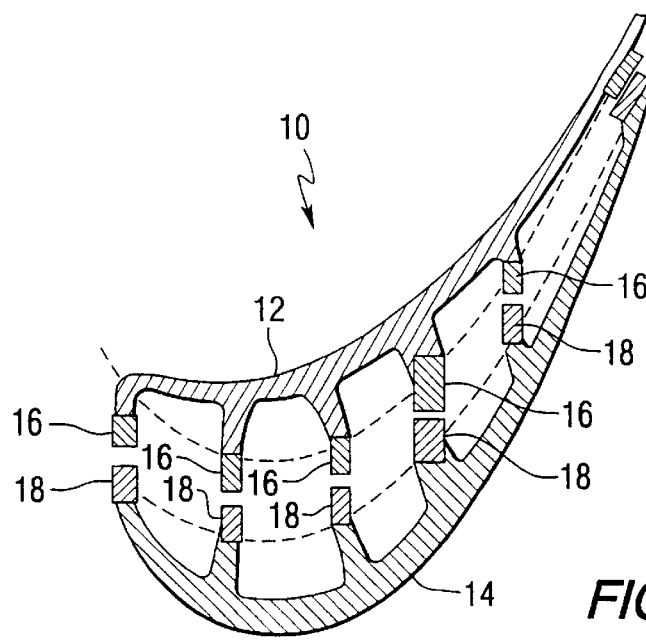
FIG. 16 is a cross-sectional view of turbine blade airfoil segments that may be machined in accordance with an embodiment of the present invention.

FIG. 16 is a cross-sectional view of a turbine blade airfoil 10 comprising two sections 12 and 14 which are separated along the camber-line of the airfoil 10. Excess material 16 and 18 is provided at the interfacing surfaces of the sections 12 and 14. FIG. 16 illustrates the appropriate geometry of the excess stock and how this is related to the motion of the electrodes during EDM machining. The excess material 16 and 18 should preferably be provided across the bond surface in the reverse direction to which it will be removed by the motion of the electrodes in the co-EDM process. This motion is normal to the overall plane of the bond and not normal to the local plane of the bond. This is particularly important for ribbed parts such as internally cooled gas turbine blades.

The application of approximately 0.030 inch excess stock to the casting across the mating surface and co-EDM machining to a 0.001 inch gap provides the excellent part fit up needed for transient liquid phase bonding.

Figure 17:
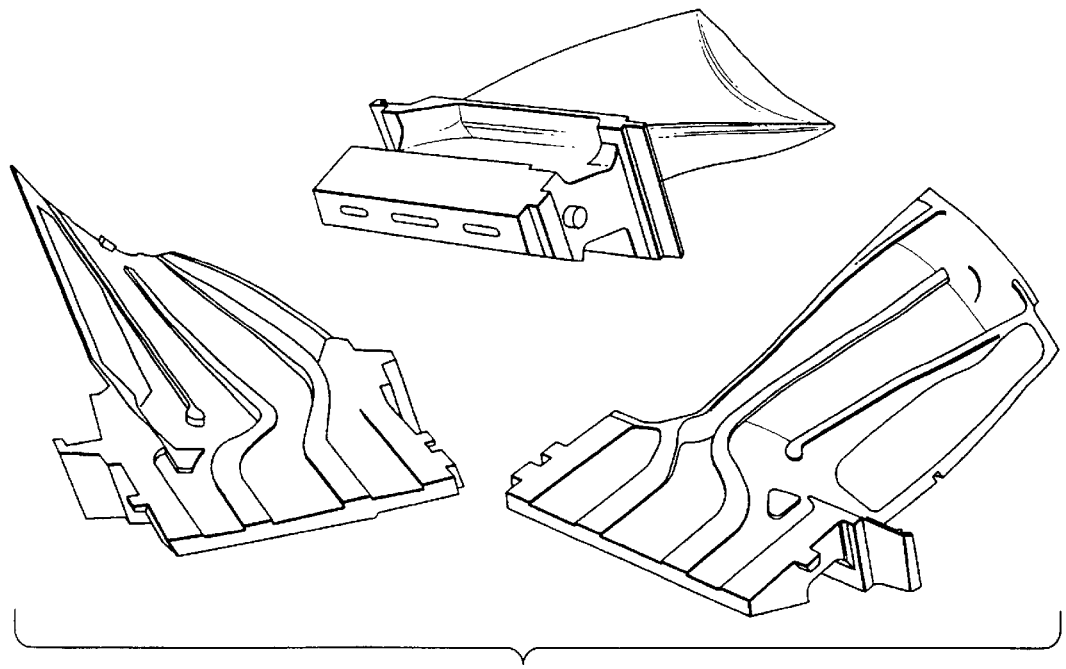
FIG. 17 is an isometric view of sectioned turbine blade halves and the fit-up of such halves in accordance with a method of the present invention.

Mating as-cast parts of a turbine blade after EDM are shown in FIG. 17.

Figure 18:
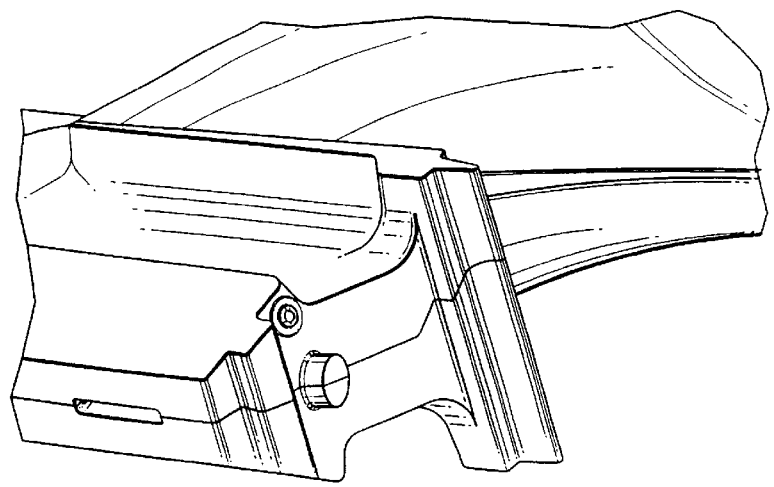
FIG. 18 is an isometric view showing the fit-up of turbine blade segments in accordance with an embodiment of the present invention.

A magnified view of the mating parts of a turbine blade after co-EDM are shown in FIG. 18.

As used herein, the term "turbine blade" means a component of a land based gas turbine, including rotating blades and stationary vanes of such turbines. Rotating blades typically comprise an airfoil portion and a root portion including a platform. Stationary vanes typically comprise a central airfoil portion and two shroud portions which can be considered to be equivalent to the root portions of the rotating blades. The turbine blades are relatively large, preferably having a total length of at least about 12 inches, an airfoil chord of at least about 4 inches, and an airfoil thickness of at least about 5/16 inch. For rotating blades, the minimum length of the airfoil portion of the blade is preferably at least about 7 inches, while the minimum length of the root portion of the blade is at least about 5 inches. The root portion of such rotating blades preferably has a width of at least about 3 inches. The present turbine blades typically have a total length of about 18 inches, with the airfoil portion having a length of about 11 inches and the root portion having a length of about 7 inches. The chord of the airfoil portion is typically about 6 inches, while the thickness of the airfoil portion is typically about 1 inch. The root portion has a typical width of about 4 or 5 inches. For rotating blades, the airfoil portion accounts for approximately 20 percent of the total weight of the blade, while the root portion accounts for approximately 80 percent of the total weight. The present turbine blades preferably weigh more than 10 pounds, typically from about 20 to about 30 pounds. This is in comparison with aircraft turbine blades which typically weigh about 2 pounds and have substantially smaller dimensions. In addition to turbine blades, other turbine components that may be fabricated in accordance with the present invention include combuster cams and hot section transitions and ducts.

In order to maintain the parts fit up during bonding, fixturing may be needed which will maintain stress across the bond surface as the parts heat up in the furnace. The fixture must withstand the high temperatures during bonding. Molybdenum outer fixtures with ceramic or nickel alloy point loading elements that induce compressive gap closing stresses on the parts by virtue of differential thermal expansion may be used.

Prior to assembling the parts in the fixture, a bonding medium of either foil or paste can be applied to the bond surface. The fixture not only ensures gap closure before the part is inserted into the furnace, but also maintains gap closure as the parts are heated. The bonding thermal and pressure cycle can be controlled to allow for outgassing of, e.g., binder species in the bonding paste if desired. Subsequently, the parts can be bonded using the cycle identified for the single crystal material.

A preferred process/sequence to develop the optimum overall properties in the part is: cast (grow) the single crystal parts of the blade to over size with about 0.030 inch excess stock normal to the bonding plane in order to provide sufficient stock for removal during fit-up processing; clean off the ceramic mold using transmitted vibration (e.g., hitting a disposable part of the casting such as the seed, ramp or the risers with a hand held hammer) and cleaning off any more adhesive ceramics using low pressure sand blasting (e.g., air pressure below 90 psi, sand particles below 120 grit); co-electrodischarge machine the parts to provide good fit up across the bonding surfaces; clean bonding surfaces using an alcohol (methyl or ethyl), acetone or a water soap based wash to remove carbonaceous residue from the EDM surfaces (i.e., the carbon film that can form during EDM machining of the single crystal surface); lightly bush surface during cleaning using a bristle brush to break up the surface carbon layer and to encourage flotation of the debris off into the cleaning fluid; apply a bonding medium into the gap between parts—either cut to shape foil or deposited paste to provide a bond fill of about 0.0025 cm (0.001 inch) of the transient liquid phase bonding medium; fixture the parts in a bonding fixture that provides controlled loads across the bonding surface to apply normal loads to portions of the external surface of the part using pins that are aligned to be normal to the bonding plane and are located to produce the maximum closure of the gap over all of the part; bond under high vacuum (greater than $10^{-5}$ τ) under the temperature cycle identified for the single crystal alloy (for CMSX-4 this is 2,250° F. for 4 hours); remove the fixture after cooling to room temperature; solution heat treat using the treatment that is conventionally employed for the alloy; external cleaning may optionally be employed (although this can be performed after precipitation heat treatment); precipitation heat treatment to optimize properties (in the case of CMSX-4 a two step precipitation treatment process at 2,084° F. for 4 hours and 1,652° F. for 24 hours); and mechanically dressing the turbine blade to shape and polishing.

As an additional step, the parts for bonding can optionally be straightened by bending using a process that will not induce recrystallization. This process involves high temperature low strain rate deformation (similar to superplastic deformation) that causes distortion of the part without incurring sufficient deformation damage to impart recrystallization.

An integrated processing path for bonding of single crystal parts to make complete turbine blades is thus provided. The sequenced processing steps provide the material quality and heat treatment steps needed to produce high quality single crystal components that will function at the extreme temperatures desired of gas turbine engine components. It provides all of the parts processing to generate optimum bond gap fit up and processing as well as optimum parts profile.

In summary, the process preferably employs: as-cast components that are removed from their ceramic molds by light blasting, co-electrodischarge machining of mating parts to ensure fit up, bonding of the parts effectively in the as-cast condition, and subsequent solution heat treating and then precipitation heat treating the parts. A modification of this sequence is also possible in which controlled high temperature shaping of the prebonded parts is employed to improve profile and part fit up.

In accordance with another embodiment of the present invention, the capability to join single crystal to polycrystalline nickel base alloys offers significant cost savings in turbine components that are now currently all single crystal. Much of this cost saving occurs because the SC alloys contain expensive rhenium, whereas the polycrystalline alloys do not contain this element. Furthermore, the ability to join thin polycrystalline skins to SC central blade sections may enable the possibility of thin walled structures for improved engine efficiency.

Selected sets of single crystal and polycrystalline nickel base superalloys may be joined to each other using foil or paste bonding media and thermal cycles that are adapted from those that are used to bond the individual alloys to themselves. The alloys that can be joined are those for which the single crystal and polycrystalline alloys exhibit compositions that are sufficiently similar that they induce similar amounts of $\gamma'$ and that the chemical compositions of the $\gamma$ and $\gamma'$ phases in the two alloys. Bonding of the alloys is accomplished by transient liquid phase bonding or the like, preferably using boron as the melting point depressant, and tailoring the foil alloying elements to match the base alloy compositions. The bonding thermal cycle is similar to the bonding thermal cycles for transient liquid phase bonding of the base materials to themselves. It occurs at a temperature that is adequate to melt the bond foil and localized regions of the single crystal and polycrystalline materials. The thermal cycle is of adequate duration to ensure that, after solidification, solid state boron diffusion is sufficient to raise local material melting temperatures above those to which the material is expected to be exposed.

Alloys that can be considered to be sufficiently close in chemistry to effectively allow transient liquid phase bonding include: CMSX-4 and CM247; CMSX-4 and CM186; PWA1480 and MarM247; and SC-16 and IN738. These alloys contain similar chemistries, effectively, for the polycrystalline materials, the chemistry of the $\gamma/\gamma'$ matrix that remains after carbide precipitation during casting. The alloy pairs are also selected so that chemistry mixing during transient liquid phase bonding is insufficient to cause the formation of deleterious precipitates, e.g the stability impairing topographically close packed (TCP) phases that can form with excess Re, Cr, etc. These pairs give very good match of chemistry and hence give excellent properties across the bond zone. Using materials that are less well matched may produce deleterious phases in the bond zone and concomitant reduction in properties. However, this might be acceptable if strength requirements are not too high and other properties such as surface corrosion resistance are desired. The chemistries of the selected alloy pairs are controlled in order to conform to these constraints.

The bonding media may be those that are conventionally used for single crystal bonding. For the case of bonding CMSX-4 to CM247, Ni-Flex 110 comprising 1.3 weight percent B as a melting point depressant may be bonded at 2,250° F. which is the recommended bonding temperature for the single crystal alloy. The difference in bonding temperature for CMSX-4 and CM247 is only about 50° F., and the melting point depression incurred by additions of boron is about 100° F. per weight percent B. Thus, if the bonding points for the single crystal and polycrystalline materials are sufficiently close, they can generally be accommodated by using the bonding process for the higher melting single crystal material. Widening of the process parameters to allow for operational efficiency can be effected by increasing the amount of boron in the foil and adjusting the bonding temperature to be closer to that of the polycrystalline material.

The bonding foil chemistries are constrained by the previously described compositional requirements, i.e., similar to base metal, reduced Al, no Ti. One exception to this similarity is the need to incorporate expensive elements such as rhenium in the polycrystalline alloy. This is a commercial requirement since polycrystalline alloys rarely contain Re and third generation single crystals rely on the Re addition for their superior high temperature strength. The advantage of joining the two materials is to eliminate the cost of the rhenium from a substantial part of the structure. Since rhenium segregates to the matrix and stabilizes $\gamma'$ by virtue of its slow diffusion, its elimination from the bond joint should not impair properties.

The objective of using a high quality bonding process such as transient liquid phase bonding is normally to produce the identical chemistry and microstructure in the bond zone that exist in the bulk of the metal segments. This is generally achieved by matching the bond foil chemistry to the base metal chemistry, taking into account the preferential segregation that will occur during dissolution and resolidification. Elements such as Ti and Al should be reduced in the bond foil compared to the base metal since these elements will tend to segregate to the center of the bond line after solidification. Since polycrystalline and single crystal alloys typically have different chemical compositions, identical matching of the bond foil composition to each side of a single crystal-to-polycrystal bond joint is not possible. However, since some sets of alloys have similar compositions and volume fractions of gamma prime, it is possible to select similar polycrystalline and single crystal alloy compositions to be bonded, and to match their compositions with a bond foil that is used to bond either of the individual alloys.

Table 4 shows the composition of several single crystal and polycrystalline alloys. From this table it can be observed that several sets of SC alloys are compositionally close to some polycrystalline alloys, e.g., CMSX-4 and CM186, PWA1480 and MarM247, SC-16 and IN738. For example, CMSX-4 and CM247 are sufficiently close in chemistry and structure to allow the production of good bonds using the transient liquid phase bonding process. This is because the effective difference in these alloys is the rhenium content which does not readily diffuse in the solid and liquid states. Moreover, a gradient of rhenium across the bond zone provides a gradual transition in structure and properties that is not harmful to the performance of the bond joint. Because of the expense of rhenium it is desirable to join rhenium containing single crystals to non-rhenium containing polycrystalline alloys.

Table 5 shows exemplary bonding alloys that can be applied to bond single crystal and polycrystalline alloys. Adequate alloy matching of aluminum rich single crystals can be obtained by bonding using Ni-Flex type alloys. These foils can also be used to bond the polycrystalline alloys of this type (CM247, MarM247, MarM002). Thus, these bond foils may be used to bond CMSX-4 type single crystal alloys to the similar class of polycrystalline alloys, e.g., CM247. Conversely, to bond chromium rich materials such as single crystal SC-16 to IN738 polycrystalline alloys, a foil such as MFB80/80A may be preferable.

As an example of bonding a single crystal alloy to a polycrystalline alloy, single crystal CMSX-4 may be bonded to polycrystalline CM247 alloy, as described previously. The bonding process employed was: mechanically polished surface to 0.05 micron finish; Ni-Flex 110 1.3B foil; 2,250° F. bond temperature; 4 hour bond time.

Figure 19:
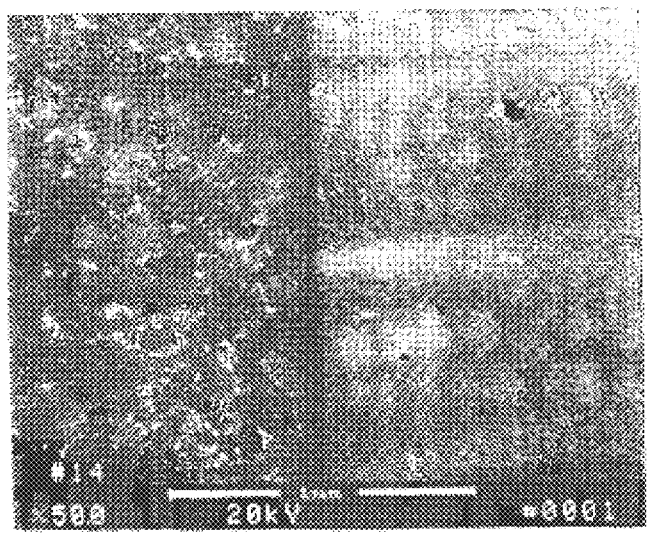
FIG. 19 is a photomicrograph showing the microstructure of a single crystal superalloy to polycrystalline superalloy bond in accordance with an embodiment of the present invention.

FIG. 19 shows the structure of the single crystal to polycrystalline bond line at low magnification.

Figure 20:
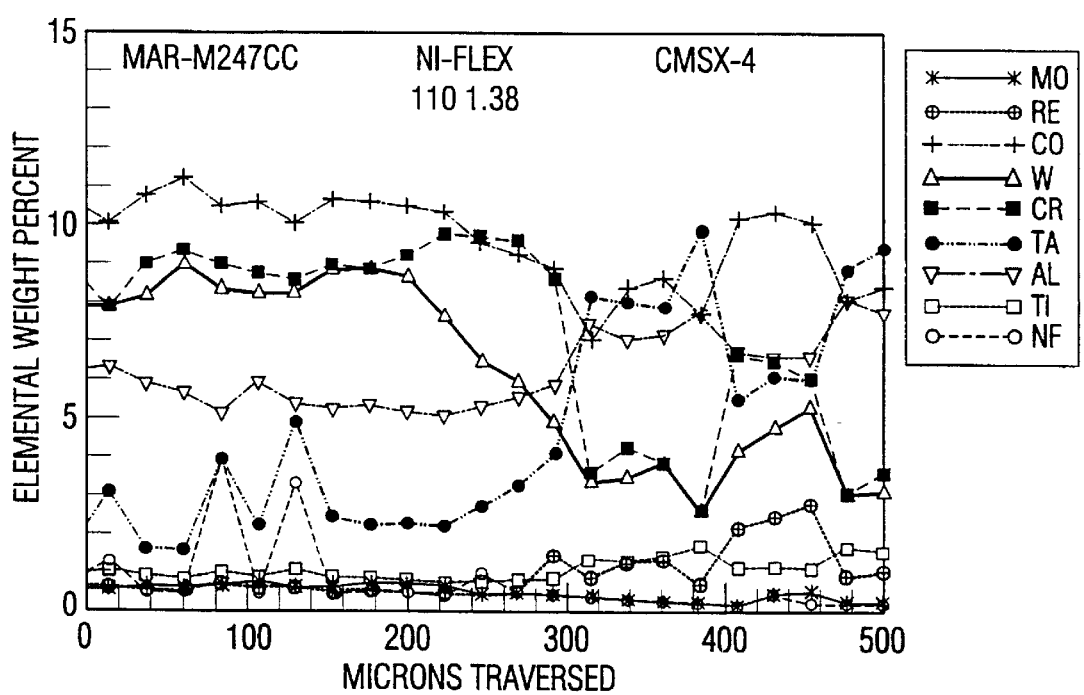
FIG. 20 is a graph showing the concentration of various elements across the bond region of a single crystal superalloy and polycrystalline superalloy joint.

FIG. 20 shows the corresponding chemistry variations across the bond regions of the single crystal CMSX-4 to polycrystalline CM247.

In order to bond single crystal and polycrystalline superalloy components as a complete process, it is preferable to integrate the heat treatment cycles for both the single crystal and polycrystalline parts of the component. In particular, it is generally not be possible for the conventionally cast polycrystalline material to withstand the high solution heat treat temperatures employed for the single crystal material. Tables 6a–c illustrate typical heat treatment cycles that may be used for the single crystal and polycrystalline alloys, CMSX-4 and CM247, and also show how the combined heat treatment cycle for bonding of a complete single crystal/polycrystalline component is derived from the two cycles.

TABLE 4

Single Crystal and Polycrystalline Turbine Blade Alloys (Weight Percent)

| Alloy | Ni | Cr | Co | Al | Ti | Nb | Mo | Ta | W | Re | Hf | Zr | B | C | Vol. % γ' |
|---|---|---|---|---|---|---|---|---|---|---|---|---|---|---|---|
| CMSX-4 | bal | 6.6 | 9.6 | 5.5 | 1.0 | — | 0.6 | 6.5 | 6.4 | 3 | 0.9 | — | — | — | 62 |
| PWA1484 | bal | 5 | 10 | 5.6 | 1 | — | — | 8.7 | 6 | 3 | 0.1 | — | — | — | 64 |
| PWA1480 | bal | 10 | 5 | 5 | 1.5 | — | — | 12 | 4 | — | — | — | — | — | 63 |
| SC-16 | bal | 16 | — | 3.5 | 3.5 | — | 3 | 3.5 | — | — | — | — | — | — | 41 |
| CMSX-11 | bal | 12.5 | 7 | 3.4 | 4.2 | 0.1 | 0.5 | 5 | 5 | — | 0.04 | — | — | — | ~45 |
| CM247 | bal | 8.1 | 9.2 | 5.6 | 0.7 | — | 0.5 | 3.2 | 9.5 | — | 1.4 | 0.015 | 0.015 | 0.07 | 62 |
| MarM002 | bal | 9 | 10 | 4.7 | 1.7 | 1 | — | — | 12.5 | — | — | — | — | — | 57 |
| MarM002 | bal | 9 | 10 | 5 | 2 | 1 | — | — | 12.5 | — | 1.8 | 0.06 | 0.02 | 0.14 | 58 |
| MarM246 | bal | 9 | 10 | 5.5 | 1.5 | — | 2.5 | 1.5 | 10 | — | — | 0.06 | 0.015 | 0.15 | 65 |
| CM186 | bal | — | — | — | — | — | — | — | — | — | — | — | — | — | — |
| IN792 | bal | 12.4 | 9 | 4.5 | 4.5 | — | 1.8 | 3.9 | 3.9 | — | 1 | 0.02 | 0.015 | 0.08 | 45 |
| IN738 | bal | 16 | 8.5 | 3.4 | 3.4 | 0.9 | 1.75 | 1.75 | 2.6 | — | — | 0.1 | 0.01 | 0.11 | 37 |

TABLE 5

Bond Foil Chemistries (Weight Percent)

| Foil Type | Ni | Cr | Co | W | Ta | Mo | Fe | Hf | Al | Ti | B | C | Si |
|---|---|---|---|---|---|---|---|---|---|---|---|---|---|
| Ni-Flex 110 (1.3B) | bal | 10.0 | 5.0 | 4.0 | 4.0 | — | — | — | 2.0 | — | 1.3 | — | — |
| Ni-Flex 110 (1.7B) | bal | 10.0 | 5.0 | 4.0 | 4.0 | — | — | — | 2.0 | — | 1.7 | — | — |
| Ni-Flex 110 (2.5B) | bal | 10.0 | 5.0 | 4.0 | 4.0 | — | — | — | 2.0 | — | 2.5 | — | — |
| Ni-Flex 115 (3.0B) | bal | 9.0 | 8.0 | 4.0 | 4.0 | — | — | 1.0 | 2.0 | — | 3.0 | — | — |
| Ni-Flex 120 (1.7B) | bal | 10.0 | 5.0 | 5.0 | 3.0 | — | — | — | — | 1.0 | 1.5 | — | — |
| Ni-Flex 120 (1.9B) | bal | 10.0 | 5.0 | 5.0 | 3.0 | — | — | — | — | 1.0 | 1.7 | — | — |
| Ni-Flex 121 (2.4B) | bal | 10.0 | 10.0 | 5.0 | — | — | — | — | — | — | 2.4 | — | — |
| Ni-Flex 121 (3.0B) | bal | 10.0 | 10.0 | 5.0 | — | — | — | — | — | — | 3.0 | — | — |
| MBF20/20A | bal | 7.0 | — | — | — | — | 3.0 | — | — | — | 3.2 | 0.06 | 4.5 |
| MBF80/80A | bal | 15.2 | — | — | — | — | — | — | — | — | 4.0 | 0.06 | — |

TABLE 6a

CMSX4 Bond and Heat Treatment

| | |
|---|---|
| Bond at 2,250° F. in as-cast condition | Liquid phase bonding and diffusion of B to elevate the local melting point from 2,250° F. to above 2,400° F. |
| Solution treat 6 hours at 2,410° F. | Homogenize bonded single structure and chemistry |
| Precipitation heat treatment 2,084° F. for 4 hours | Initiate formation of coarse γ' which will grow to 0.5 μm on subsequent aging heat treatment |
| Aging heat treatment 1,600° F. for 24 hours | Grow coarse γ' to 0.5 μm and precipitate fine, e.g., 200–500Å sized secondary spheroidal γ' |

TABLE 6b

CM247 Bond and Heat Treatment

| | |
|---|---|
| Bond at 2,150° F. for 4 hours | Liquid phase bonding and diffusion of B to elevate melting point to above 2,150° F. |
| Solution heat treatment 2,150° F. for 4 hours | Partially homogenize polycrystalline chemistry and γ phase structure |
| Note: the two steps listed above can occur simultaneously | |
| Precipitation heat treat 1,950° F. for 4 hours | Initiate formation of coarse γ' which will grow on subsequent aging heat treatment |
| Aging heat treatment 1,600° F. for 24 hours | Grow coarse γ' to optimum size (~0.5 μm) and precipitate 200–500Å secondary spheroidal γ'. Also precipitate interdendritic and grain boundary carbides |

TABLE 6c

Combined CMSX-4 - CM247 Bond and Heat Treatment

| | |
|---|---|
| Bond SC segments only at 2,250° F. for 4 hours | Liquid phase bonding and diffusion of B to elevate melting point of SC portions above 2,410° F. |
| Solution heat treat bonded SC segments only at 2,410° F. for 4 hours | Homogenize SC and bond region chemistry and structure |
| Bond CC to SC sections at 2,150° F. for 4 hours | Liquid phase bonding and diffusion of B into bonded regions to elevate melting point of CC above 2,150° F.; partially solutionize CC; initiate coarse γ' precipitation in SC |
| Precipitation heat treat* 1,950° F. for 4 hours | Grow coarse γ' in SC portion; initiate coarse γ' precipitation in CC region |
| Age heat treatment 1,600° F. for 24 hours | Grow coarse γ' to near optimum size in SC and polycrystalline portions; precipitate fine secondary γ' spheroids in both portions; also precipitate interdentritic/intergranular carbides in CC portion |

*May be modified by an equivalent treatment practice to accommodate coating cycles.

In the combined cycle, the single crystal pieces are bonded in the as-cast condition. The bonded single crystal pieces are then solution treated at relatively high temperature. The solution treated single crystal segment and the as-cast polycrystalline segments are bonded under conditions that would be employed to bond the polycrystalline material. This step induces some growth of the primary γ' in the single crystal alloy. The bonded aggregate is then subjected to another aging step which induces growth of the primary γ' in the polycrystalline alloy and more growth of the primary γ' in the single crystal alloy. The aggregate is subjected to a final low temperature aging step which modifies the primary γ' and also grows the secondary γ' in both alloys to produce an optimized microstructure in the single crystal/polycrystalline blade. The temperature and times shown in the previous tables demonstrate how the full heat treatment cycle may be selected to optimize the overall structure and properties.

EXAMPLES

The effect of bonding foil chemistry and thermal treatments on the microstructure and mechanical properties were assess experimentally. Initially, several bonding foil chemistries and thermal processes were employed to generate samples for metallographic assessment. The processes that produced the most homogeneous chemistry and microstructure across the bond line and throughout the base metal were selected for further assessment by testing the tensile and creep properties.

CMSX-4 base material was supplied in the as-cast conditions as single crystal slabs approximately 9.5×76.2×152.4 mm (0.375×3×6 inches). The bonding media were obtained as 50 μm (0.002 inch) thick commercial bonding foils.

The boron levels of the bonding foils are actually B ranges since two of the foils were supplied in several forms with slightly different boron levels: Ni-Flex 110 was supplied with 1.3%, 1.7% and 2.5% B levels and Ni-Flex 120 was supplied with 1.5%, 1.7% and 1.9% B levels. Furthermore, it should be noted that since the foils were fabricated by a diffusion process, the boron concentration was not uniform through the depth of the foil. The boron levels quoted in the table are average concentrations over the depth of the foil.

Sample preparation for the metallographic and mechanical testing phases of the program was similar. The only differences being that larger samples were employed for the mechanical test samples and that refined surface preparation methods developed during the initial phase of the program were available for bonding the mechanical test samples. The metallographic samples' bonding surfaces were finished by low stress grinding, 120 grit, 320 grit, or 600 grit polishing, or electropolishing, whereas the bonding surfaces of the mechanical test samples were finished only by low stress grinding.

To avoid issues relating to sample misorientation, all bonding samples were prepared by cutting and rejoining individual single crystals, i.e., an original single crystal slab was sectioned perpendicular to its crystal growth direction and the surfaces so produced were rebonded after surface finishing. All of the initial cutting of the samples was performed using a metallographic silicon carbide abrasive wheel which was also used to extract the smaller metallographic samples from the width of the slab. The bonded samples for metallographic evaluation were approximately 13×13×13 mm (0.5×0.5×0.5 inch) parallelpipeds while the samples prepared for mechanical test sample fabrication were 9.5×76.2×38 mm (0.375×3×1.5 inch) i.e., full width/one quarter slab height.

Bonding was conducted in a high vacuum furnace during which time the samples were held in place by molybdenum fixturing. Prior to bonding, the foils and the single crystals were thoroughly degreased. The bonding foil was cut to exactly fit the cross-section of the bond and was fit into place between the two mating surfaces as the samples were assembled in the fixture. This fixture not only maintained alignment of the single crystals but also developed controlled loads of the order of 0.1 to 1.0 MPa (15–150 psi) across the bond line during furnace heat up and at the bonding temperature.

The CMSX-4 slabs were bonded in either the as-cast or solution treated condition. The solution treatment, which is typical for this alloy, was conducted under inert atmosphere and involved a ramped cycle up to a six hour hold at 1,593 K (1,320° C., 2,408° F.). The cooling rate after solution treatment averaged approximately 433 K/minute (160° C./minute, 300° F./minute). Two different bonding cycles were investigated for bonding the single crystals. Cycle A was performed at 1,543 K (1,270° C., 2,318° F.) for 4 hrs while Cycle B was performed at 1,505 K (1,232° C., 2,250° F.) for 4 hrs. Both bonding cycles were conducted in a vacuum of better than $1.3 \times 10^{-2}$ Pa ($1 \times 10^{-5}$ torr).

Following bonding, samples were either solution treated and then precipitation aged or simply precipitation aged. The post-bond solution treatment was identical to the pre-bond solution treatment. The precipitation age was the standard two-step heat treatment recommended for this alloy, specifically, a slow ramp to 1,413 K (1,140° C., 2,084° F.) for 4 hrs and air cool followed by 1,123 K (850° C., 1,562° F.) for 20–24 hrs with an air cool. The combinations of foils chemistries and thermal processing conditions that were evaluated are summarized in Table 7.

TABLE 7

Bonding Foil Chemistries and Thermal Processing/Surface Preparation Combinations

| Sample Name | Foil Name | Foil B Content, wt. % | Pre-Bond Thermal Conditions | Bonding Cycle | Post-Bond Thermal Processing |
|---|---|---|---|---|---|
| A | Ni-Flex 110 | 2.5 | As-Cast | A | Solution + Precip. |
| B | Ni-Flex 110 | 2.5 | Sol'n | A | Solution + Precip. |
| C | Ni-Flex 110 | 2.5 | Sol'n | B | Solution + Precip. |
| D | Ni-Flex 115 | 3.0 | As-Cast | A | Solution + Precip. |
| E | Ni-Flex 115 | 3.0 | Sol'n | A | Solution + Precip. |
| F | Ni-Flex 110 | 1.7 | As-Cast/ 120 polish | A | Solution + Precip. |
| G | Ni-Flex 120 | 1.7 | As-Cast/ 320 polish | A | Solution + Precip. |
| H | Ni-Flex 110 | 1.3 | As-Cast/ 600 polish | A | Solution + Precip. |
| I | Ni-Flex 110 | 1.3 | As-Cast | B | Solution + Precip. |
| J | Ni-Flex 110 | 1.3 | Sol'n | A | Solution + Precip. |
| K | Ni-Flex 110 | 1.3 | Sol'n | A | Solution + Precip. |
| L | Ni-Flex 110 | 1.3 | Sol'n | A | Solution + Precip |
| M | Ni-Flex 110 | 1.3 | Sol'n | A | Solution + Precip. |
| N | Ni-Flex 110 | 1.3 | As-Cast | B | Precip. |
| O | Ni-Flex 110 | 2.5 | Solution | B | Precip. |

Notes:
Solution = solution treated;
Precip. = precipitation treated

The samples listed in Table 7 were characterized using scanning electron microscopy (SEM) and energy dispersive spectroscopy (EDS) chemical analysis. Additional microstructural work, including light optical microcopy, electron probe micro-analysis, and scanning transmission electron microscopy (STEM), was performed on selected samples. Samples were examined after bonding and, where applicable, after post bond solution treating, to assess the ceical uniformity across the bond region. The samples were subsequently examined after precipitation aging to determine the form and uniformity of the γ' structure.

All of the conditions listed in Table 7 induced reasonably uniform chemistries across the bond line and generated high volume fractions of γ' within the bond region. Differences were observed in the specific γ' volume fraction and, particularly, in the γ' morphology as a function of thermal processing and bond composition. The optimum structure, which was equivalent to the optimally heat treated base alloy, was generated in sample I using foil Ni-Flex 110 with 1.3% B, the lower bonding temperature of 1,505 K (1,232° C., 2,250° F.), and subsequent solution treating and precipitation aging.

When the higher bonding temperature cycle was employed with the increased boron levels, excessive bond fluidity, manifested by liquid run-out down the side of the samples was observed. Excessive bond fluidity is not desired in joining precision structures. Lower boron contents and lower bonding temperatures would avoid excessive fluidity and if they can produce good bond region structures, should be preferred choices of bonding systems.

Although the foil chemistry, with respect to the major elements, appeared to have little effect on the bonded region chemistry, it did have a marked effect on the A' morphology in the bond region. The γ' formed in the bond region of the sample fabricated with foil Ni-Flex 115 is more rounded than that which was formed in the bond region of the sample fabricated with foil Ni-Flex 110. The more cuboidal γ'/γ' structure is the more preferable, since it is indicative of greater anisotropy and stability under creep conditions; Ni-Flex 110 was, therefore, selected as the preferred foil bonding foil for CMSX-4.

Examination of the structures produced by different foils, different substrate conditions and different post-bond thermal processing indicates that all of these parameters affect the degree to which the bonding process dissolves the base metal and subsequently controls the chemistry and structure of the bond region. The optimum microstructure is achieved when dissolution of the base metal causes the composition of the liquid pool to be sufficient to solidify with approximately the same composition as the base material but to be insufficient to allow the formation of any eutecite γ' on final solidification at the bond line.

Excessive dissolution of the base metal causing the subsequent production of eutectic γ' at the bond line was observed in Sample C that was bonded with 2.5% boron. Even though the bonding foil contains less aluminum and titanium than the base alloy, aggressive dissolution of these elements into the bonding pool causes subsequent formation of eutectic γ'. If the eutectic particles are small, they can be dissolved by post-bonding solution treatment; it was noticed that higher boron bonds required post-bond solution treating to develop better γ' microstructures. However, because post bond solution treating cannot guarantee the dissolution of the larger eutectic particles, it appears that lower boron levels and bonding temperatures are preferable.

Conversely, when aluminum and titanium are dissolved from the base metal, the chemistry and structure of the γ'in the bond zone are modified. The consequence of this depletion is reduced γ' volume fraction and rounding of the strengthening γ' cuboids. Since more aluminum in the γ' gives rise to a more angular γ' morphology, increased dissolution of base metal aluminum should give rise to better anisotropy and creep stability. For sample I, the substrate was in the as-cast condition and for sample M the substrate was in the solution treated condition prior to bonding. Sample I displayed the preferred angular γ' morphology, presumably due to more aluminum being available for dissolution from the eutectic and interdendritic regions of the as-cast structure.

To assess the effect of surface preparation on bond quality, facing surfaces were prepared with a range of finishes, from 120 grit heavy polishing through 320 and 600 grit heavy polishing, light 600 grit polishing, low stress grinding and electropolishing. While none of the surface preparations induced recrystallization, the heavier mechanical polishes produced very small rounded γ' particles in the bond zone, whereas the optimum, large cuboidal γ' morphology was produced by light 600 grit polishing, low stress grinding and electropolishing. Electropolishing, while producing an excellent stress free smooth surface, tended to round the edges of the sample and the bonds fabricated from electropolished samples often exhibited edge notches from this effect. Since low stress grinding produced the optimum bond region and because this method of surface finishing allowed for precise machining of test blocks, it was selected as the method of mating surface preparation for the mechanical test samples.

The mechanical properties demonstrated by the well bonded single crystals have been shown to be very close to those of the conventional, non-bonded, optimally heat treated single crystals. Table 8 presents some tensile property data for some of the bonded samples and compares these data to those of baseline CMSX-4. Table 9 presents creep rupture data for the same bonding processes with the expected data for baseline CMSX-4.

Specimens for mechanical testing were prepared by bonding two quarter sections of the original cast slabs back together to form 9.5×76.2×76 mm (0.375×3×3 inch) slabs. These slabs were subsequently cut into 9.5 mm (0.375 inch) wide specimen blanks that were later machined into 0.6 mm (0.25 inch) gage diameter creep and tensile samples. The axes of the test samples were, therefore, parallel to the original growth direction of the single crystal slabs.

Tensile tests were conducted at room temperature, 1,172 K (899° C., 1,650° F.) and 1,255 K (982° C., 1,800° F.). The specimens produced strengths that were close to the values expected for good CMSX-4 single crystals. However, some of the ductility values were somewhat lower than those expected for CMSX-4. Nevertheless, the recorded values are still high compared to those of polycrystalline superalloys tested under similar conditions. Moreover, almost all of the fractures of the bonded tensile specimens occurred in the base material.

In contrast to the tensile fractures, all of the creep fractures tended to occur within the bond regions. Nevertheless, the creep rupture lives were not only very close to the expected lives for CMSX-4, but in several cases exceeded the lives of unbonded single crystal sample taken from the same casting batch. The localization of the fractures within the bond zones was, however, manifested by the reduced ductilities of the bonded samples which were always lower than those of the unbonded samples. In the absence of any microstructural gradient across the bond zone, the reason for this constrain is not readily apparent. Since the creep rupture ductility values displayed by the best performing samples were always in the range of 10 to 20 percent, the bonded structure appears to have more than sufficient strength and ductility for service.

The strength and ductility values of the creep and tensile tests support the selections of the bond foils and thermal processing conditions for bonding of single crystal CMSX-4. The mechanical properties developed in this program indicate that bonded CMSX-4 single crystals display a significant fraction (at least 90 percent) of the thermal and mechanical properties exhibited by pure single crystal CMSX-4. Comparing these properties with those required to support the design designated loads across the potential bond planes for fabricated blades indicates that the bonded joint region should not be a source of weakness or vulnerability in fabricated blades.

TABLE 8

Tensile Properties of Bonded CMSX-4

| Sample Name | Processing | Failure Location | Yield Strength (ksi) | UTS (ksi) | % Elongation | % R.A. |
|---|---|---|---|---|---|---|
| | | CMSX-4 | | | | |
| | Database Typical | Base Metal | 130 | 150 | 14 | 18 |
| C | 110 2.5B S/B/S + P | Base Metal | 140 | 152 | 13.5 | 16.1 |
| N | 110 1.3B A–C/B/P | Base Metal | 117, 118 | 142, 157 | 14.5, 25.4 | 15.4, 24.4 |
| O | 110 2.5B S/B/P | Base Metal | 111 | 122 | 14.7 | 17.1 |
| I | 110 1.3B A–C/B/S + P | Base Metal | N/R | 137 | 2.6 | 6.4 |
| | Acceptance Criteria | Base Metal | 115 | 123 | — | — |
| | Database Typical | Base Metal | 110 | 150 | 18 | 37 |
| C | 110 2.5B S/B/S + P | Base Metal | 114 | 140 | 3.4 | 5.9 |
| N | 110 1.3B A–C/B/P | Bond | 100, 99 | 128, 128 | 13.7, 16.5 | 19.6, 24.3 |
| O | 110 2.5B S/B/P | Base Metal | 105, 106 | 130, 131 | 22.9, 18.5 | 34.5, 28.4 |
| I | 110 1.3B AC/B/S + P | Base Metal | 106 | 106 | 1.1 | 2.6 |
| | Acceptance Criteria | Base Metal | 95 | 130 | — | — |
| | Database Typical | Base Metal | 95 | 125 | 18 | 45 |
| C | 110 2.5B S/B/S + P | Base Metal | 102 | 117 | 4.1 | 6.9 |
| N | 110 1.3B AC/B/P | Bond | 74, 83 | 103, 99 | 10.4, 8.1 | 16.8, 17.8 |
| O | 110 2.5B S/B/P | Base Metal | 90, 82 | 101, 104 | 19.3, 19.5 | 26.3, 37.2 |
| I | 110 1.3B A–C/B/S + P | Base Metal | 110, 61 | 119, 61 | 13.6, 4.6 | 21.4, 7.9 |
| | Acceptance Criteria | Base Metal | 78 | 110 | — | — |
| | | CM247LC/MAR-M247 | | | | |
| | Database Typical | Base Metal | 116 | 139 | 7.5 | 11 |
| | 115 3B A–C/B/P | Base Metal | 129 | 141 | 8.5 | 9.1 |
| | 115 3B A–C/B | Base Metal | 111 | 137 | 10.1 | 17.2 |
| | Acceptance Criteria | Base Metal | 94 | 126 | 6 | 7 |
| | Database Typical | Base Metal | 105 | 132 | 9 | 11 |

TABLE 8-continued

Tensile Properties of Bonded CMSX-4

| Sample Name | Processing | Failure Location | Yield Strength (ksi) | UTS (ksi) | % Elongation | % R.A. |
|---|---|---|---|---|---|---|
| | 115 3B A–C/B/P | Bond | 89 | 109 | 1.1 | 1.8 |
| | 115 3B A–C/B | Bond | 80 | 110 | 2.3 | 4.9 |
| | Acceptance Criteria | Base Metal | 75 | 105 | 7.5 | 8 |
| | Database Typical | Base Metal | 50 | 80 | 14 | 19 |
| | 115 3B A–C/B/P | Bond | 54 | 67 | 1.5 | 1.8 |
| | 115 3B A–C/B | Bond | 52 | 70 | 0.4 | 1.1 |
| | Acceptance Criteria | Base Metal | 30 | 65 | 12 | 15 |

TALBE 9

Creep Properties CMSX-4

| Sample Name | Temperature | Stress (ksi) | Processing | Failure Location | Rupture Time (hours) | % Elongation | % R.A. |
|---|---|---|---|---|---|---|---|
| | 1650 F. | 50 | Database Typical | Base Metal | ~1000 | — | — |
| C | 1650 F. | 50 | 110 2.5B S/B/S + P | Bond | 872.7 | 18.5 | 237 |
| N | 1650 F. | 50 | 110 1.3B A–C/B/P | Bond | 342.5 | 11.4 | 17.8 |
| O | 1650 F. | 50 | 110 2.5B S/B/P | Bond | 393.1 | 6.4 | 8.3 |
| I | 1650 F. | 50 | 110 1.3B A–C/B/S + P | Bond | 1125.4, 405 | 11.2, 3.1 | 18.7, 9.4 |
| | 1650 F. | 50 | No Bond, Base Alloy | Base Metal | 893 | 33.6 | 34.9 |
| | 1650 F. | 80 | Database Typical | Base Metal | 30–100 | — | — |
| C | 1650 F. | 80 | 110 2.5B S/B/S + P | Bond | 67.6 | 13.8 | 18.4 |
| N | 1650 F. | 80 | 110 1.3B A–C/B/P | Bond | 11.5 | 7.6 | 17 |
| O | 1650 F. | 80 | 110 2.5B S/B/P | Bond | 19.8 | 16.7 | 20.2 |
| I | 1650 F. | 80 | 110 1.3B A–C/B/S + P | Base Metal, Bond | 16.7, 59.6 | 5.1, 10.6 | 5.3, 21.2 |
| | 1650 F. | 80 | No Bond, Base Alloy | Base Metal | 7.8 | 15.1 | 23.8 |
| | 1800 F. | 28 | Database Typical | Base Metal | ~1000 | — | — |
| C | 1800 F. | 28 | 110 2.5B S/B/S + P | Bond | 793.6 | 23.5 | 24 |
| N | 1800 F. | 28 | 110 1.3B A–C/B/P | Bond | 235.5 | 6.7 | 10.8 |
| O | 1800 F. | 28 | 110 2.5B S/B/P | Bond | 187.9 | 2.6 | 3.9 |
| I | 1800 F. | 28 | 110 1.3B A–C/B/S + P | Bond, Bond | 784.4, 838 | 15.3, 17.1 | 15.4, 18.5 |
| | 1800 F. | 28 | No Bond, Base Alloy | Base Metal | 384 | 24.3 | 27.6 |
| | 1800 F. | 45 | Database Typical | Base Metal | ~100 | — | — |
| C | 1800 F. | 45 | 110 2.5B S/B/S + P | Bond, Bond | 97.8, 102.8 | 20.2, 25.6 | 26.3, 27.8 |
| N | 1800 F. | 45 | 110 1.3B A–C/B/P | Bond | 6 | 2.5 | 6.2 |
| O | 1800 F. | 45 | 110 2.5B S/B/P | Bond | 21.2 | 11.3 | 24.6 |
| I | 1800 F. | 45 | 110 1.3B A–C/B/S + P | Bond, Bond, Base Metal | 32.1, 78.1, 81.8 | 3.9, 17.8, 11.8 | 9.8, 23.5, 16.3 |
| | 1800 F. | 45 | No Bond, Base Alloy | Base Metal | 75.6 | 27.6 | 28 |

The properties presented in Tables 8 and 9 reflect the properties of bonded single crystals in which the two proportions of the crystal are well aligned and the axis of testing is very close to the <001> orientation, which is the strongest testing direction in nickel base single crystals. The properties of a bonded single crystal are expected to display the same orientation dependence as those of an unbonded single crystal. Because the microstructure is continuous across the original interface, no excessive plane of weakness is presented by the bond region misorientation of the mechanical test axis away from the normal to the bond line, and should not lead to any deviation from the behavior of conventional single crystals when the two bonded portions share the same crystallographic orientation.

A different situation exists when the two crystal portions are not of the identical orientation. In this case, the misorientation between the two crystal structures causes a formation of a grain boundary structure between the two portions after bonding. In single crystals at high temperatures, grain boundaries are known to be sources of weakness and sites for premature failure. Experience with nickel base superalloys has shown that materials properties are gradually degraded as the misorientation of the boundary increases.

Casting specifications generally allow the presence of grain boundaries of up to about 10 degrees, although 15° to 20° misorientations have been known to be allowed in some cases. Since the presence of a high misorientation does not affect the structure of the grain boundary that is formed on bonding, the properties of a bonded grain boundary will be identical to those of a grain boundary that is formed in a conventional casting. Thus, the allowable mismatch across a bonded grain boundary should be identical to that allowed for a cast grain boundary, for example, 10°, 15° or 20° depending upon the acceptance criteria. In order to assure processability by bonding the crystallographic orientations of the parts to be bonded should lie within these limits.

Whereas particular embodiments of this invention have been described above for purposes of illustration, it will be evident to those skilled in the art that numerous variations of the details of the present invention may be made without departing from the invention as defined in the appended claims.

What is claimed is:

1. A method of bonding cast superalloys comprising:
    casting separate superalloy segments;
    preparing interfacing surfaces of adjacent segments;
    bonding the segments together within a bond zone with a bonding medium which includes a melting point depressant; and precipitation heat treating the bonded segments by heating the bonded segments at a series of temperatures, such that the bond zone between the precipitation heat treated segments remains substantially unrecrystallized.

2. The method of claim 1, further comprising solution heat treating the bonded segments before the precipitation heat treatment of the bonded segments.

3. The method of claim 1, where the precipitation heat treating step heats the bonded segments at a first temperature followed by heating the bonded segments at a second temperature below the first temperature.

4. The method of claim 1, wherein at least one of the superalloy segments comprises a single crystal superalloy.

5. The method of claim 4, wherein the single crystal superalloy is nickel based.

6. The method of claim 5, wherein the single crystal nickel base superalloy comprises about 6.6 weight percent Cr, about 9.6 weight percent Co, about 5.5 weight percent Al, about 1 weight percent Ti, about 0.6 weight percent Mo, about 6.5 weight percent Ta, about 6.4 weight percent W, about 3 weight percent Re, about 0.9 weight percent Hf and the balance Ni.

7. The method of claim 5, wherein at least another one of the superalloy segments comprises a polycrystalline nickel base superalloy bonded to the single crystal nickel superalloy.

8. The method of claim 5, wherein at least another one of the superalloy segments comprises a directionally solidified nickel base superalloy bonded to the single crystal nickel base superalloy.

9. The method of claim 8, wherein the directionally solidified nickel base superalloy comprises about 8.1 weight percent Cr, 9.2 weight percent Co, 5.6 weight percent Al, 0.7 weight percent Ti, 0.5 weight percent Mo, 3.2 weight percent Ta, 9.5 weight percent W, 1.4 weight percent Hf, 0.015 weight percent Zr, 0.015 weight percent B, 0.07 weight percent C, and the balance Ni.

10. The method of claim 1, further comprising preparing the interfacing surfaces of the adjacent segments to a tolerance of less than about 0.0025 cm.

11. The method of claim 1, further comprising preparing the interfacing surfaces of the adjacent segments by co-electrodischarge machining.

12. The method of claim 1, further comprising:
providing excess material at bond surfaces between the adjacent segments extending in a direction substantially normal to an overall plane of the bond; and
preparing the interfacing surfaces of the adjacent segments by removing the excess material.

13. The method of claim 1, wherein the melting point depressant comprises boron.

14. The method of claim 1, wherein the bonding medium comprises a bonding foil.

15. The method of claim 1, wherein at least one of the superalloy segments comprises a single crystal nickel base superalloy, and a bond zone between the single crystal nickel base superalloy segment and an adjacent superalloy segment comprises substantially the same microstructure as the single crystal nickel base superalloy segment.

16. The method of claim 1, wherein at least one of the superalloy segments comprises a single crystal nickel base superalloy, and a bond zone between the single crystal nickel base superalloy segment and an adjacent superalloy segment comprises substantially the same chemical composition as the single crystal nickel base superalloy segment.

17. The method of claim 1, wherein at least two of the adjacent superalloy segments comprise single crystal nickel base superalloys, and orientations of the single crystals of the nickel base superalloys are aligned within 20 degrees of each other.

18. The method of claim 1, wherein at least two of the adjacent superalloy segments comprise single crystal nickel base superalloys, and orientations of the single crystals of the nickel base superalloys are aligned within 15 degrees of each other.

19. The method of claim 1, wherein at least two of the adjacent superalloy segments comprise single crystal nickel base superalloys, and orientations of the single crystals of the nickel base superalloys are aligned within 10 degrees of each other.

20. The method of claim 1, wherein the bonded segments have a total length of greater than about 12 inches, a total width of greater than about 4 inches and a total thickness of greater than about 5/16 inch.

21. The method of claim 1, wherein the bonded segments comprise a turbine blade.

22. The method of claim 1, wherein said bonding step comprises bonding the segments together by transient liquid phase bonding and a $\gamma/\gamma'$ microstructure in the bond zones is optimized so that the $\gamma/\gamma'$ microstructure in the bond zones is substantially equivalent to that elsewhere in the segments.

23. A method of bonding cast superalloys comprising:
bonding within a bond zone at least two single crystal superalloy segments together;
solution heat treating the bonded single crystal superalloy segments;
bonding, within a bond zone, at least one polycrystalline superalloy segment to at least one of the solution heat treated single crystal superalloy segments; and
precipitation heat treating the bonded single crystal and polycrystalline superalloy segments by heating the segments at one or more temperatures such that the bond zones between segments remains substantially unrecrystallized, and a $\gamma/\gamma'$ microstructure in the bond zones is optimized.

24. The method of claim 23, where the precipitation heat treating step heats the bonded segments at a first temperature followed by heating the bonded segments at a second temperature below the first temperature.

25. The method of claim 23, wherein the single crystal and polycrystalline superalloys are nickel based.

26. The method of claim 25, wherein the single crystal nickel base superalloy comprises about 6.6 weight percent Cr, about 9.6 weight percent Co, about 5.5 weight percent Al, about 1 weight percent Ti, about 0.6 weight percent Mo, about 6.5 weight percent Ta, about 6.4 weight percent W, about 3 weight percent Re, about 0.9 weight percent Hf, and the balance Ni.

27. The method of claim 26, wherein the polycrystalline nickel base superalloy comprises about 8.1 weight percent Cr, 9.2 weight percent Co, 5.6 weight percent Al, 0.7 weight percent Ti, 0.5 weight percent Mo, 3.2 weight percent Ta, 9.5 weight percent W, 1.4 weight percent Hf, 0.015 weight percent Zr, 0.015 weight percent B, 0.07 weight percent C, and the balance Ni.

28. The method of claim 23, wherein orientations of the single crystals of the single crystal superalloys are aligned within 20 degrees of each other.

29. The method of claim 23, wherein the bonded segments have a total length of greater than about 12 inches, a total width of greater than about 4 inches and a total thickness of greater than about 5/16 inch.

30. The method of claim 23, wherein the bonded segments comprise a turbine blade.

31. The method of claim 23, wherein bonding of the at least two single crystal segments and bonding of polycrystalline segments to single crystal segments is by transient liquid phase bonding and where the bond between the bonded single crystal segments and the at least one polycrystalline superalloy segment displays a continuous gradation of chemistry and microstructure and the mechanical properties in the bond zone are between those of the base single crystal and the polycrystalline material.

* * * * *